US012785355B2

(12) United States Patent
Lin et al.

(10) Patent No.: US 12,785,355 B2
(45) Date of Patent: Nov. 3, 2026

(54) HETEROGENEOUS CHIP STACKING METHOD

(71) Applicant: Shine Optics Technology Company Limited, Chongqing City (CN)

(72) Inventors: Kung-An Lin, Chongqing City (CN); Jie-Qiao Lin, Chongqing City (CN); Che-Hao Hsu, Chongqing City (CN)

(73) Assignee: Shine Optics Technology Company Limited, Chongqing City (CN)

( * ) Notice: Subject to any disclaimer, the term of this patent is extended or adjusted under 35 U.S.C. 154(b) by 408 days.

(21) Appl. No.: 18/650,016

(22) Filed: Apr. 29, 2024

(65) Prior Publication Data

US 2025/0105204 A1 Mar. 27, 2025

(30) Foreign Application Priority Data

Sep. 27, 2023 (CN) ......................... 202311269980.0

(51) Int. Cl.

| | |
|---|---|
| ***H01S 5/0237*** | (2021.01) |
| ***H10W 72/00*** | (2026.01) |
| ***H10W 72/90*** | (2026.01) |
| ***H10W 80/00*** | (2026.01) |
| ***H10W 90/00*** | (2026.01) |

(52) U.S. Cl.

CPC ......... *H01S 5/0237* (2021.01); *H10W 72/011* (2026.01); *H10W 72/072* (2026.01); *H10W 72/985* (2026.01); *H10W 80/016* (2026.01); *H10W 80/334* (2026.01); *H10W 80/335* (2026.01); *H10W 90/792* (2026.01)

(58) Field of Classification Search

CPC ...... H01S 5/02355–0237; H10W 80/334–335; H10W 90/791–798

See application file for complete search history.

(56) References Cited

U.S. PATENT DOCUMENTS

| | | | | |
|---|---|---|---|---|
| 10,833,049 | B2 * | 11/2020 | Brunschwiler | H10W 72/013 |
| 2022/0406697 | A1 * | 12/2022 | Kim | H10W 70/60 |

FOREIGN PATENT DOCUMENTS

| | | |
|---|---|---|
| CN | 115881830 A | 3/2023 |

* cited by examiner

*Primary Examiner* — Daniel P Shook

(74) *Attorney, Agent, or Firm* — Li & Cai Intellectual Property Office

(57) ABSTRACT

A heterogeneous chip stacking method includes providing a first chip, in which the first chip has a plurality of first convex pillar structures, and each first convex pillar structure has a first bonding pad portion; providing a second chip different from the first chip, in which the second chip has a plurality of second convex pillar structures, and each second convex pillar structures having a second bonding pad portion; placing the first chip on the second chip, in which the first bonding pad portions of the first convex pillar structures and the second bonding pad portions of the second convex pillar structures are in direct contact with each other respectively; and then applying at least one of a predetermined pressure, a predetermined temperature, and a predetermined ultrasonic frequency to tightly couple the first bonding pad portions and the second bonding pad portions with each other respectively.

10 Claims, 20 Drawing Sheets

HETEROGENEOUS CHIP STACKING METHOD

CROSS-REFERENCE TO RELATED PATENT APPLICATION

This application claims the benefit of priority to China Patent Application No. 202311269980.0, filed on Sep. 27, 2023, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a stacking method, and more particularly to a heterogeneous chip stacking method.

BACKGROUND OF THE DISCLOSURE

In the related art, a plurality of heterogeneous chips are mostly individually arranged on a circuit substrate, which makes the layout space of the circuit substrate unable to be effectively utilized. In addition, before a chip is prepared to be placed on the circuit substrate by flip-chip bonding, a plurality of pre-prepared solder balls (or pre-made solder balls or gold balls) will be placed on the circuit substrate in advance to serve as an electrical connection between the chip and the circuit substrate. However, since the size of the solder ball has a predetermined reduction limit, when the pad size of the chip or the pad spacing between the two adjacent chips is too small, the solder ball cannot serve as an electrical connection between the chip and the circuit substrate.

SUMMARY OF THE DISCLOSURE

In response to the above-referenced technical inadequacy, the present disclosure provides a heterogeneous chip stacking method configured for stacking two heterogeneous chips (i.e., a first chip and a second chip) together by directly contacting and tightly coupling a plurality of first bonding pad portions of a plurality of first convex pillar structures of the first chip with a plurality of second bonding pad portions of a plurality of second convex pillar structures of the second chip, respectively.

In order to solve the above-mentioned problems, one of the technical aspects adopted by the present disclosure is to provide a heterogeneous chip stacking method, which includes providing a first chip, in which the first chip has a plurality of first convex pillar structures gradually formed outward from the first chip within a first predetermined time, and each of the first convex pillar structures has a first bonding pad portion; providing a second chip that is different from the first chip, in which the second chip has a plurality of second convex pillar structures gradually formed outward from the second chip within a second predetermined time, and each of the second convex pillar structures has a second bonding pad portion; placing the first chip on the second chip, in which the first bonding pad portions of the first convex pillar structures of the first chip and the second bonding pad portions of the second convex pillar structures of the second chip are in direct contact with each other respectively; and then applying at least one of a predetermined pressure, a predetermined temperature, and a predetermined ultrasonic frequency to tightly couple the first bonding pad portions of the first convex pillar structures of the first chip and the second bonding pad portions of the second convex pillar structures of the second chip with each other respectively. The first convex pillar structure is not formed by directly placing a pre-prepared solder ball on the first chip. The second convex pillar structure is not formed by directly placing another pre-prepared solder ball on the second chip.

In order to solve the above-mentioned problems, another one of the technical aspects adopted by the present disclosure is to provide a heterogeneous chip stacking method, which includes providing a first chip, in which the first chip has a plurality of first convex pillar structures gradually formed outward from the first chip within a first predetermined time, and each of the first convex pillar structures has a first bonding pad portion; providing a second chip that is different from the first chip, in which the second chip has a plurality of second convex pillar structures gradually formed outward from the second chip within a second predetermined time, and each of the second convex pillar structures has a second bonding pad portion; placing the first chip on the second chip, in which the first bonding pad portions of the first convex pillar structures of the first chip and the second bonding pad portions of the second convex pillar structures of the second chip are in direct contact with each other respectively; and then applying at least one of a predetermined pressure, a predetermined temperature, and a predetermined ultrasonic frequency to tightly couple the first bonding pad portions of the first convex pillar structures of the first chip and the second bonding pad portions of the second convex pillar structures of the second chip with each other respectively.

Therefore, in the heterogeneous chip stacking method provided by the present disclosure, by virtue of "providing a first chip, in which the first chip has a plurality of first convex pillar structures gradually formed outward from the first chip within a first predetermined time, and each of the first convex pillar structures has a first bonding pad portion," "providing a second chip that is different from the first chip, in which the second chip has a plurality of second convex pillar structures gradually formed outward from the second chip within a second predetermined time, and each of the second convex pillar structures has a second bonding pad portion," "placing the first chip on the second chip, in which the first bonding pad portions of the first convex pillar structures of the first chip and the second bonding pad portions of the second convex pillar structures of the second chip are in direct contact with each other respectively" and "applying at least one of a predetermined pressure, a predetermined temperature, and a predetermined ultrasonic frequency to tightly couple the first bonding pad portions of the first convex pillar structures of the first chip and the second bonding pad portions of the second convex pillar structures of the second chip with each other respectively," the two heterogeneous chips (i.e., the first chip and the second chip) can be stacked together. For example, the first convex pillar structure is not formed by directly placing a pre-prepared solder ball on the first chip, and the second convex pillar structure is not formed by directly placing another pre-prepared solder ball on the second chip.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
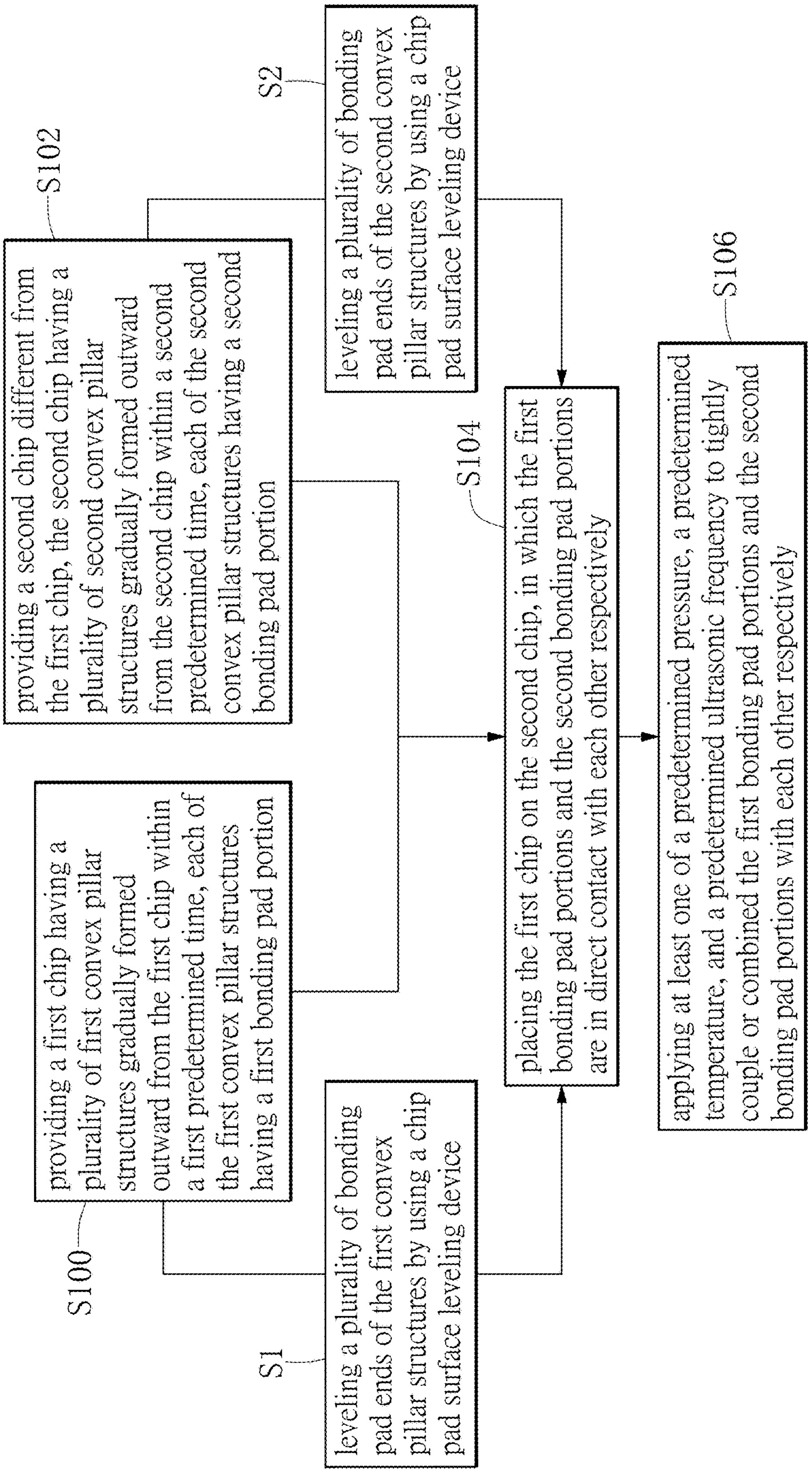
FIG. 1 is a flowchart of a heterogeneous chip stacking method provided by the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Figure 10:
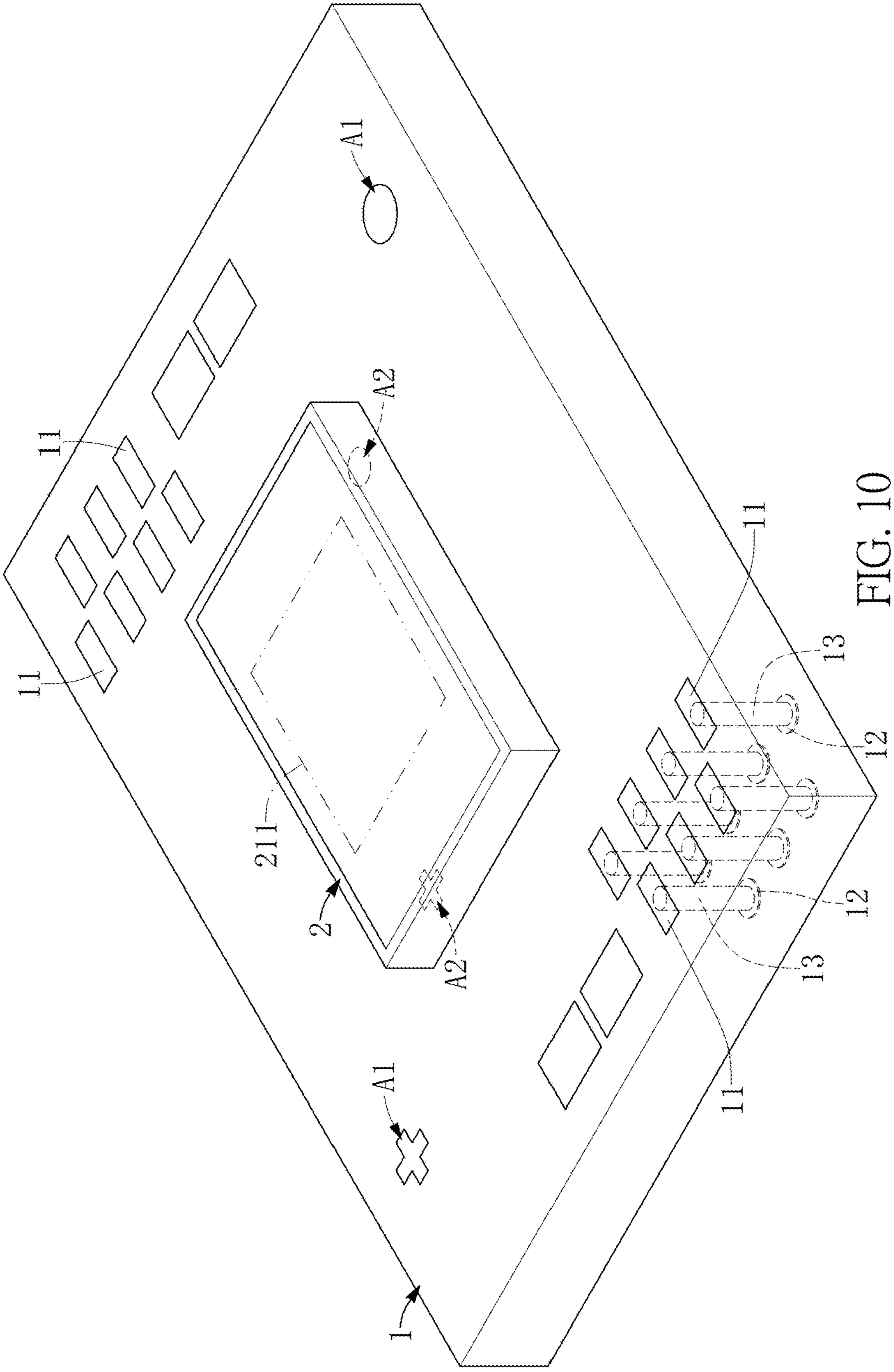
FIG. 10 is a schematic perspective view of a heterogeneous chip stacking structure provided by the present disclosure.
Figure 11:
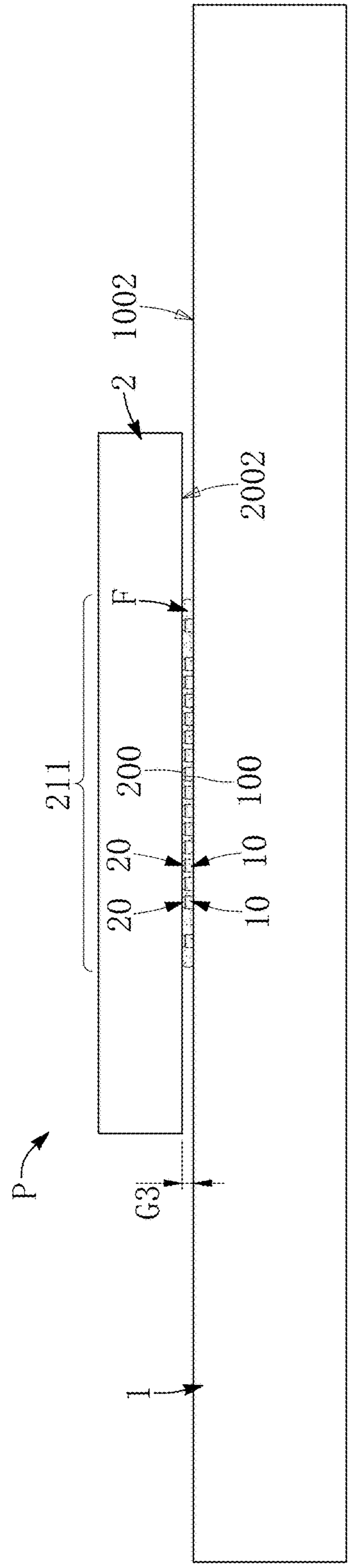
FIG. 11 is a schematic side view of the heterogeneous chip stacking structure provided by the present disclosure.

Referring to FIG. 1 to FIG. 11, a first embodiment of the present disclosure provides a heterogeneous chip stacking method (such as a heterogeneous integration method for different types of chips), which includes: firstly, referring to FIG. 1 and FIG. 2 to FIG. 5, providing a first chip 1, in which the first chip 1 has a plurality of first convex pillar structures 10 (or first convex pillar structures) gradually formed (or gradually grow) outward from the first chip 1 within a first predetermined time, and each of the first convex pillar structures 10 has a first bonding pad portion 100 (or a first bonding end) (step S100); next, referring to FIG. 1 and FIG. 6 to FIG. 9, providing a second chip 2 that is different from the first chip 1 (for example, the base materials of the first chip 1 and the second chip 2 are different, or the materials of other parts of the first chip 1 and the second chip 2 are different), in which the second chip 2 has a plurality of second convex pillar structures 20 (or second convex pillar structures) gradually formed (or gradually grow) outward from the second chip 2 within a second predetermined time, and each of the second convex pillar structures 20 has a second bonding pad portion 200 (or a second bonding end) (step S102); then, referring to FIG. 1, FIG. 10 and FIG. 11, placing the first chip 1 on the second chip 2, in which the first bonding pad portions 100 of the first convex pillar structures 10 of the first chip 1 and the second bonding pad portions 200 of the second convex pillar structures 20 of the second chip 2 are in direct contact with each other respectively without any other connecting material (or in another possible embodiment, a conductive material can be formed between the first bonding pad portion 100 and the second bonding pad portion 200, so that the first bonding pad portion 100 and the second bonding pad portion 200 may be in indirect contact) (step S104); afterward, referring to FIG. 1, FIG. 10 and FIG. 11, applying at least one of a predetermined pressure (such as a pressure between 100 g and 2000 g, or any positive integer between 100 g and 2000 g), a predetermined temperature (such as a temperature between 200° C. and 350° C., or any positive integer between 200° C. and 350° C.), and a predetermined ultrasonic frequency (such as a frequency between 40 KHz and 42 KHz, or any positive integer between 40000 Hz and 42000 Hz) to tightly couple or combined the first bonding pad portions 100 of the first convex pillar structures 10 of the first chip 1 and the second bonding pad portions 200 of the second convex pillar structures 20 of the second chip 2 with each other respectively (step S106). It should be noted that since the sizes of the first convex pillar structure 10 and the second convex pillar structure 20 are very small, the first convex pillar structure 10 is not formed by directly implanting or placing a pre-prepared solder ball (such as a pre-made solder ball or gold ball) on the first chip 1, and the second convex pillar structure 20 is not formed by directly implanting or placing another pre-prepared solder ball (such as a pre-made solder ball or gold ball) on the second chip 2.

Figure 4:
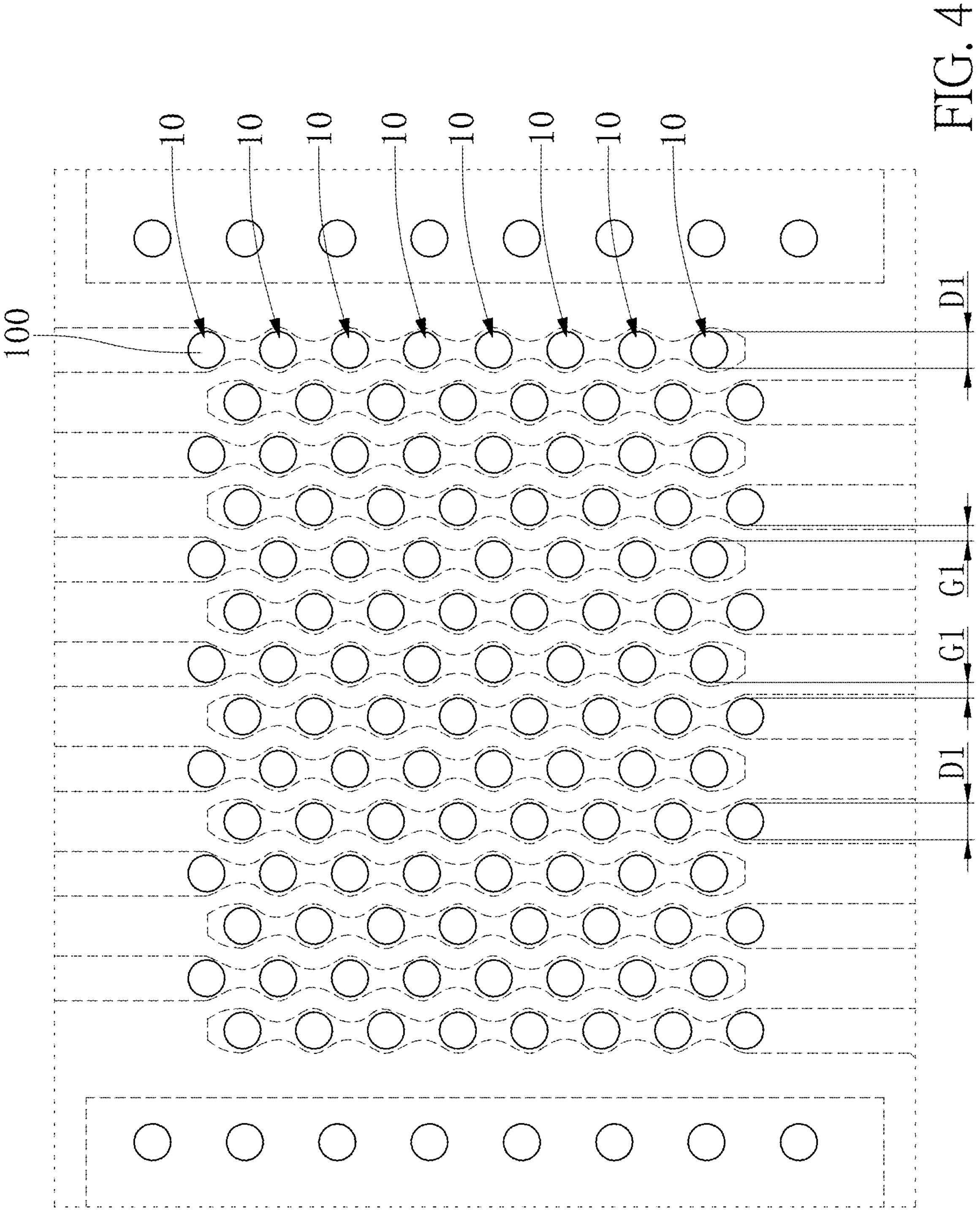
FIG. 4 is a schematic enlarged view of part IV of FIG. 3.
Figure 5:
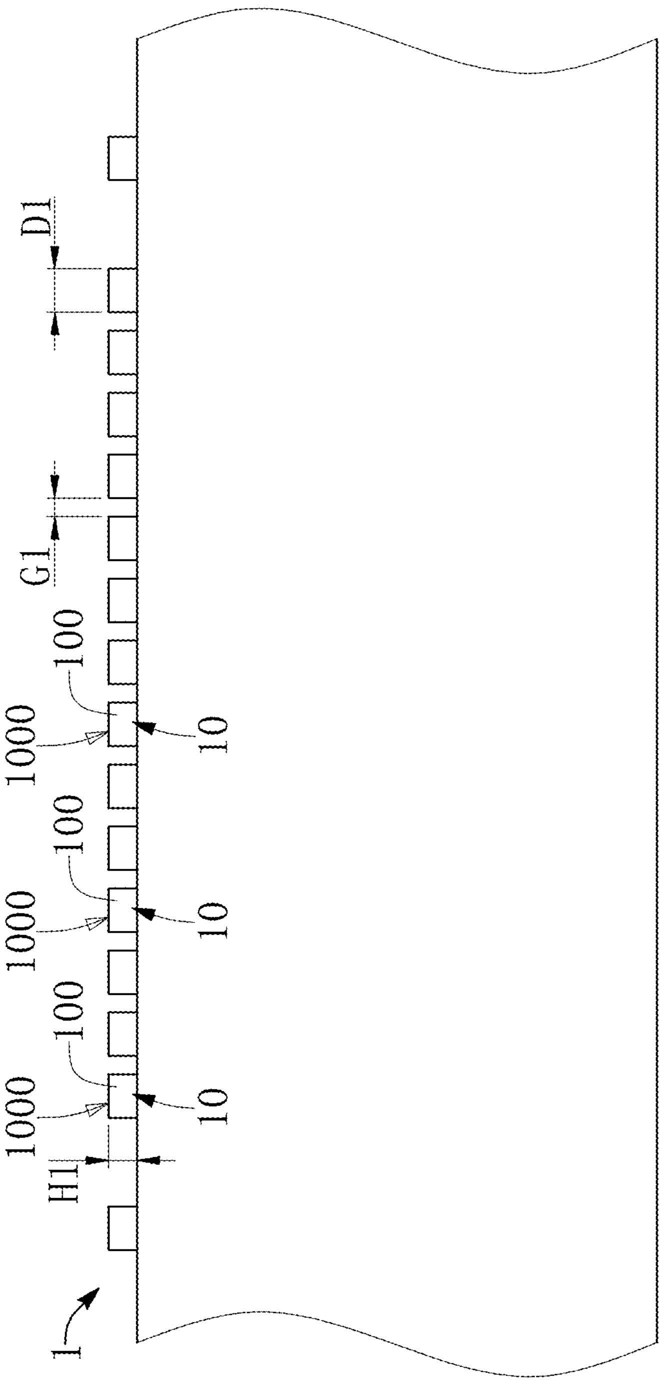
FIG. 5 is a schematic side view of the first chip provided by the present disclosure.

For example, referring to FIG. 1 and FIG. 2 to FIG. 5, in the step S100 of providing the first chip 1, the first convex pillar structures 10 (such as upright cylindrical structures, or upright cylindrical pads) of the first chip 1 can be gradually formed on the first chip 1 within the first predetermined time through sputtering, evaporation or any other feasible forming method, and the first chip 1 can be a single-photon avalanche diode (SPAD) chip containing silicon (Si), or any kind of semiconductor light detector, or any kind of silicon substrate chip. Moreover, referring to FIG. 3 and FIG. 4, the first convex pillar structures 10 of the first chip 1 can be divided into a plurality of series bonding pad areas (for example, as shown in FIG. 4, there are multiple straight and staggered series bonding pad areas) that are separate from each other, and the first convex pillar structures 10 in each of the series bonding pad areas can be connected to each other in series through conductive lines (not labeled). In addition, referring to FIG. 2 and FIG. 3, the first chip 1 includes a plurality of top conductive pads 11 respectively and electrically connected to the series bonding pad areas through conductive lines (not labeled), a plurality of bottom conductive pads 12 respectively corresponding to the top conductive pads 11, and a plurality of conductive penetration bodies 13 each correspondingly connected between a corresponding one of the top conductive pads 11 and a corresponding one of the bottom conductive pads 12 thereby forming a plurality of through silicon vias (TSV). It should be noted that the first chip 1 provided by the present disclosure can also omit the plurality of bottom conductive pads 12 and the plurality of conductive penetration bodies 13, and only retain the plurality of top conductive pads 11 provided on the first chip 1. More particularly, referring to FIG. 4 and FIG. 5, each of the first convex pillar structures 10 may have a first diameter D1 ranging from 15 μm to 30 μm (such as any positive integer between 15 μm and 30 μm) and a first height H1 ranging from 10 μm to 20 μm (such as any positive integer between 10 μm and 20 μm), a surface roughness (or a flatness) of a bonding pad end 1000 of each of the first convex pillar structures 10 of the first chip 1 may not greater than 1 μm (such as any positive integer less than 1000 nm), and a first pad spacing G1 between any two adjacent ones of the first convex pillar structures 10 of the first chip 1 may be between 35 μm and 45 μm (such as any positive integer between 35 μm and 45 μm). However, the aforementioned details are disclosed for exemplary purposes only, and are not meant to limit the scope of the present disclosure.

For example, as shown in FIG. 1 and FIG. 6 to FIG. 9, in the step S102 of providing the second chip 2, the second convex pillar structures 20 (such as stepped cylindrical structures, or stepped cylindrical pads) of the second chip 2 are gradually formed in a receiving groove 2001 of the second chip 2 within the second predetermined time through sputtering, evaporation or any other feasible forming method, and the second chip 2 can be a vertical cavity surface emitting laser (VCSEL) chip containing gallium arsenide (GaAs), or any type of surface emitting laser (SEL). Moreover, referring to FIG. 6, FIG. 7 and FIG. 8, the second convex pillar structures 20 of the second chip 2 are separate from each other by a predetermined distance, and the second chip 2 has a light-emitting area 211 that is larger than a distribution area of the second convex pillar structures 20, an outer frame area 212 surrounding the light-emitting area 211, and a suction nozzle contact area 213 (i.e., a contact area for a suction nozzle) located between the light-emitting area 211 and the outer frame area 212, and the second convex pillar structure 20 and the light-emitting area 211 of the second chip 2 can be respectively disposed on two opposite surfaces of the second chip 2. In addition, referring to FIG. 6, FIG. 7 and FIG. 9, the second chip 2 has a lower surface 2002 and a receiving groove 2001 (or an accommodating groove) recessed from the lower surface 2002, and each of the second convex pillar structures 20 includes a pillar-shaped base 20A disposed in the receiving groove 2001 and a pillar-shaped conductor 20B disposed on the pillar-shaped base 20A, and a top surface (i.e., a bonding pad end 2000) of the pillar-shaped base 20A of each of the second convex pillar structures 20 and the lower surface 2002 of the second chip 2 are flush with each other. More particularly, referring to FIG. 7 and FIG. 9, the pillar-shaped base 20A of each of the second convex pillar structures 20 may have a second diameter D2 ranging from 25 μm to 35 μm (such as any positive integer between 25 μm and 35 μm) and a second height H2 ranging from 5 μm to 10 μm (such as any positive integer between 5 μm and 10 μm), and the pillar-shaped conductor 20B of each of the second convex pillar structures 20 may have a third diameter D3 (such as any positive integer between 15 μm and 25 μm) ranging from 15 μm to 25 μm and a third height H3 ranging from 3 μm to 8 μm (such as such as any positive integer between 3 μm and 8 μm). In addition, a surface roughness (or flatness) of a bonding pad end 2000 of each of the second convex pillar structures 20 of the second chip 2 may not greater than 1 μm (such as any positive integer less than 1000 nm), and a second pad spacing G2 between any two adjacent ones of the second convex pillar structures 20 of the second chip 2 may be between 35 μm and 45 μm (such as any positive integer between 35 μm and 45 μm). However, the aforementioned details are disclosed for exemplary purposes only, and are not meant to limit the scope of the present disclosure.

Figure 2:
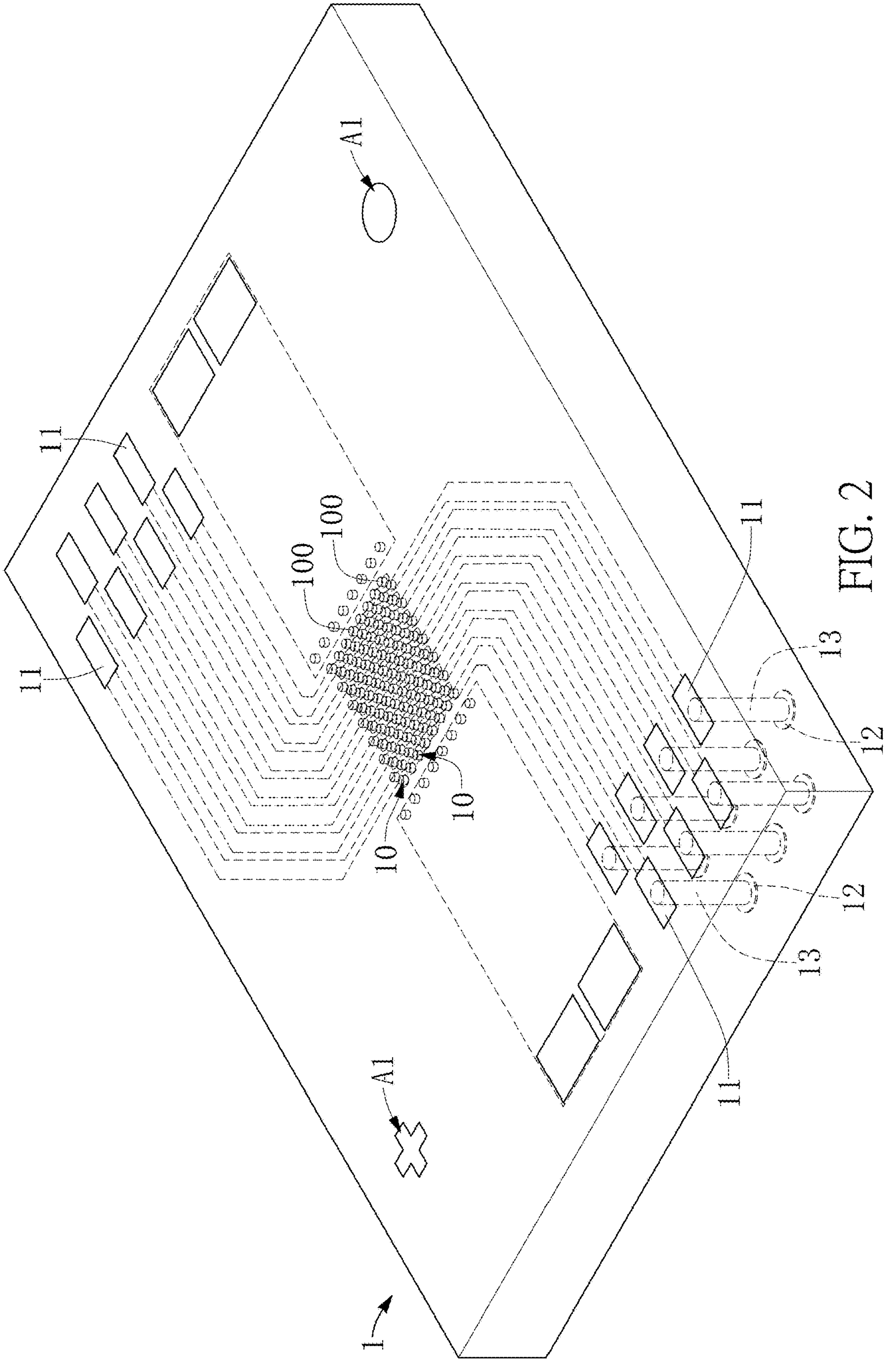
FIG. 2 is a schematic perspective view of a first chip provided by the present disclosure.
Figure 3:
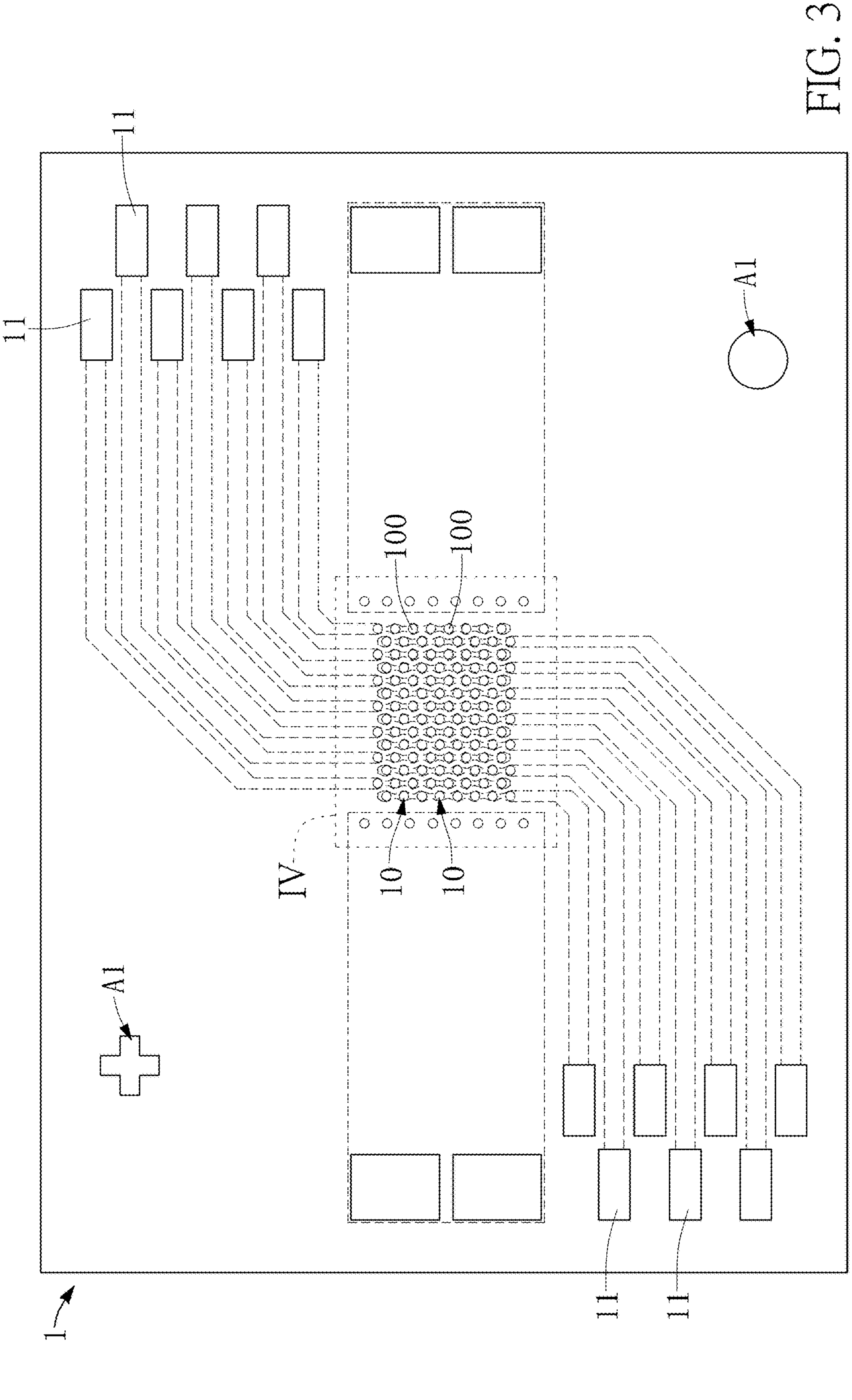
FIG. 3 is a schematic top view of the first chip provided by the present disclosure.
Figure 6:
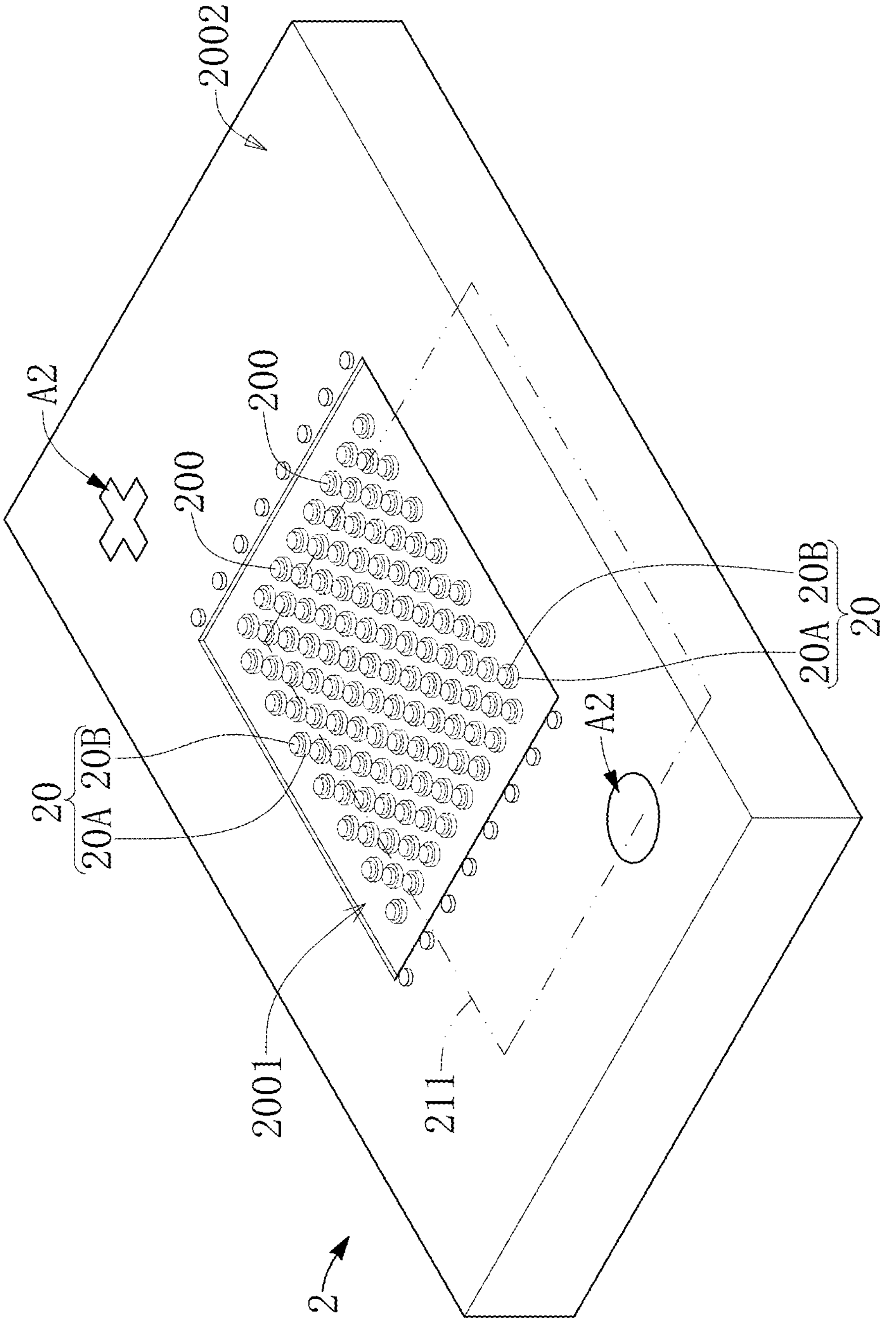
FIG. 6 is a schematic perspective view of a second chip provided by the present disclosure.
Figure 7:
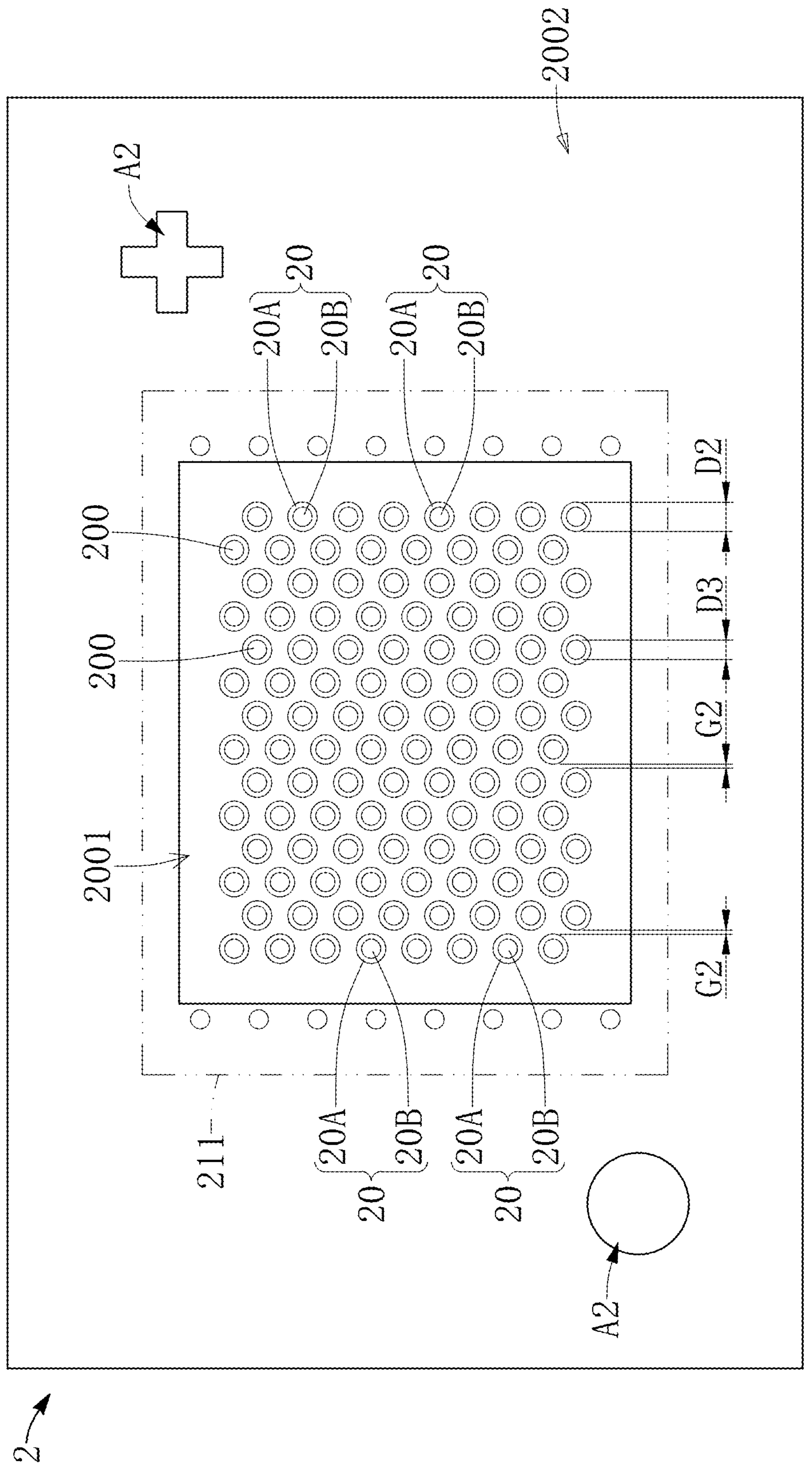
FIG. 7 is a schematic top view of the second chip provided by the present disclosure.

It should be noted that, for example, referring to FIG. 2 and FIG. 6, each of the first chips 1 has two first alignment marks M1 arranged diagonally or randomly on a top side thereof, and each of the second chips 2 has two second alignment marks M2 arranged diagonally or randomly on a bottom side thereof. Therefore, as shown in FIG. 10, in the step S104 of placing the first chip 1 on the second chip 2, the two first alignment marks M1 of the first chip 1 are adjacent and correspond to the two second alignment marks M2 of the second chip 2, respectively. That is to say, the two first alignment marks M1 (a cross mark and a circular mark) of the first chip 1 can respectively correspond to the two second alignment marks M2 (another cross mark and another circular mark) of the second chip 2, thereby ensuring that the orientation of the first chip 1 relative to the second chip 2 is correct. Moreover, referring to FIG. 2, FIG. 6, FIG. 10 and FIG. 11, in the step S104 of placing the first chip 1 on the second chip 2 (when the first chip 1 is disposed on the second chip 2), an insulating filling material F (or an insulative filler) can be configured to be filled between the first chip 1 and the second chip 2, thereby increasing the bonding strength of the first chip 1 and the second chip 2 after they are joined or bonded together, in which the insulating filling material F may be any kind of underfill. In addition, referring to FIG. 10 and FIG. 11, in the step S104 of placing the first chip 1 on the second chip 2 (when the first chip 1 is disposed on the second chip 2), a chip vertical distance G3 between a lower surface 2002 of the second chip 2 and an upper surface 1002 of the first chip 1 can be between 10 μm and 15 μm (such as any positive integer between 10 μm and 15 μm). That is to say, when the first chip 1 is disposed on the second chip 2, the first bonding pad portions 100 (or first bonding end portions) of the first convex pillar structures 10 of the first chip 1 and the second bonding pad portions 200 (or second bonding end portions) of the second convex pillar structures 20 of the second chip 2 are in direct contact with each other and closely combined respectively, and the first chip 1 and the second chip 2 will avoid direct contact due to the barrier of the insulating filling material F, so that the first chip 1 and the second chip 2 will be separated from each other by a predetermined vertical distance. However, the aforementioned details are disclosed for exemplary purposes only, and are not meant to limit the scope of the present disclosure.

It should be noted that, for example, referring to FIG. 1, FIG. 2, FIG. 6, FIG. 19 and FIG. 20, before the step S104 of placing the first chip 1 on the second chip 2, the heterogeneous chip stacking method further includes: leveling a plurality of bonding pad ends 1000 of the first convex pillar structures 10 of the first chip 1 or a plurality of bonding pad ends 2000 of the second convex pillar structures 20 of the second chip 2 (i.e., the first chip 1 in FIG. 19 and FIG. 20 can be replaced with the second chip 2) by using a chip pad surface leveling device M (step S1 or step S2), thereby making a surface roughness of the bonding pad end 1000 of each of the first convex pillar structures 10 of the first chip 1 or a surface roughness of the bonding pad end 2000 of each of the second convex pillar structures 20 of the second chip 2 is not greater than 1 μm (such as any positive integer less than 1000 nm). However, the aforementioned details are disclosed for exemplary purposes only, and are not meant to limit the scope of the present disclosure.

Following the content mentioned above, for example, as shown in FIG. 19 and FIG. 20, the chip pad surface leveling device M includes a signal control module M1 (such as CPU, GPU or any micro controller), a glass carrying module M2 (or a substrate carrying module) electrically connected to the signal control module M1, and a temperature control module M3 (or a temperature adjust module) electrically connected to the signal control module M1. Moreover, the glass carrying module M2 can be configured to carry and move a leveling glass substrate GS (such as a glass substrate or any material substrate having a predetermined surface flatness that can be a flattened glass substrate) to contact the first convex pillar structures 10 of the first chip 1 or the second convex pillar structures 20 of the second chip 2. In addition, the temperature control module M3 can be configured to apply a predetermined temperature (such as a heating temperature between 200° C. and 350° C.) to the first convex pillar structures 10 of the first chip 1 or the second convex pillar structures 20 of the second chip 2 (i.e., the first chip 1 in FIG. 19 and FIG. 20 can be replaced with the second chip 2), and the glass carrying module M2 can be configured to apply a predetermined pressure (such as a downforce between 100 g and 1500 g) to the first convex pillar structures 10 of the first chip 1 or the second convex pillar structures 20 of the second chip 2 (i.e., the first chip 1 in FIG. 19 and FIG. 20 can be replaced with the second chip 2) through the leveling glass substrate GS, thereby making a surface roughness of the bonding pad end 1000 of each of the first convex pillar structures 10 of the first chip 1 or a surface roughness of the bonding pad end 2000 of each of the second convex pillar structures 20 of the second chip 2 is not greater than 1 μm. However, the aforementioned details are disclosed for exemplary purposes only, and are not meant to limit the scope of the present disclosure.

Second Embodiment

Referring to FIG. 2 to FIG. 11, a second embodiment of the present disclosure provides a heterogeneous chip stacking structure P (such as a heterogeneous integration structure for different types of chips), which includes a first chip 1 and a second chip 2. Referring to FIG. 2 to FIG. 5, the first chip 1 has a plurality of first convex pillar structures 10 that can be gradually formed outward from the first chip 1 within a first predetermined time, and each of the first convex pillar structures 10 has a first bonding pad portion 100. Referring to FIG. 6 to FIG. 9, the second chip 2 has a plurality of second convex pillar structures 20 that can be gradually formed outward from the second chip 2 within a second predetermined time, and each of the second convex pillar structures 20 has a second bonding pad portion 200. Referring to FIG. 10 to FIG. 11, the first chip 1 is configured to be disposed on the second chip 2, and the first bonding pad portions 100 of the first convex pillar structures 10 of the first chip 1 and the second bonding pad portions 200 of the second convex pillar structures 20 of the second chip 2 can be in direct contact with each other and tightly coupled with each other, respectively. It should be noted that since the sizes of the first convex pillar structure 10 and the second convex pillar structure 20 are very small, the first convex pillar structure 10 is not formed by directly implanting or placing a pre-prepared solder ball (such as a pre-made solder ball or gold ball) on the first chip 1, and the second convex pillar structure 20 is not formed by directly implanting or placing another pre-prepared solder ball (such as a pre-made solder ball or gold ball) on the second chip 2.

For example, the heterogeneous chip stacking structure P provided by the second embodiment of the present disclosure can be manufactured by the heterogeneous chip stacking method provided by the first embodiment of the present disclosure, and the first chip 1 and the second chip 2 of the heterogeneous chip stacking structure P provided by the second embodiment of the present disclosure can be the same as or different from the first chip 1 and the second chip 2 of the heterogeneous chip stacking method provided by the first embodiment of the present disclosure. However, the aforementioned details are disclosed for exemplary purposes only, and are not meant to limit the scope of the present disclosure.

Third Embodiment

Referring to FIG. 12 to FIG. 18, a third embodiment of the present disclosure provides a heterogeneous chip stacking device S (such as a heterogeneous integration device for different types of chips), which includes a substrate carrying structure S1, a position-limiting substrate structure S2 (or a limiting substrate structure), a first cover structure S3, a second cover structure S4 and a chip carrying structure S5 (or a plurality of chip carrying structures S5).

Figure 12:
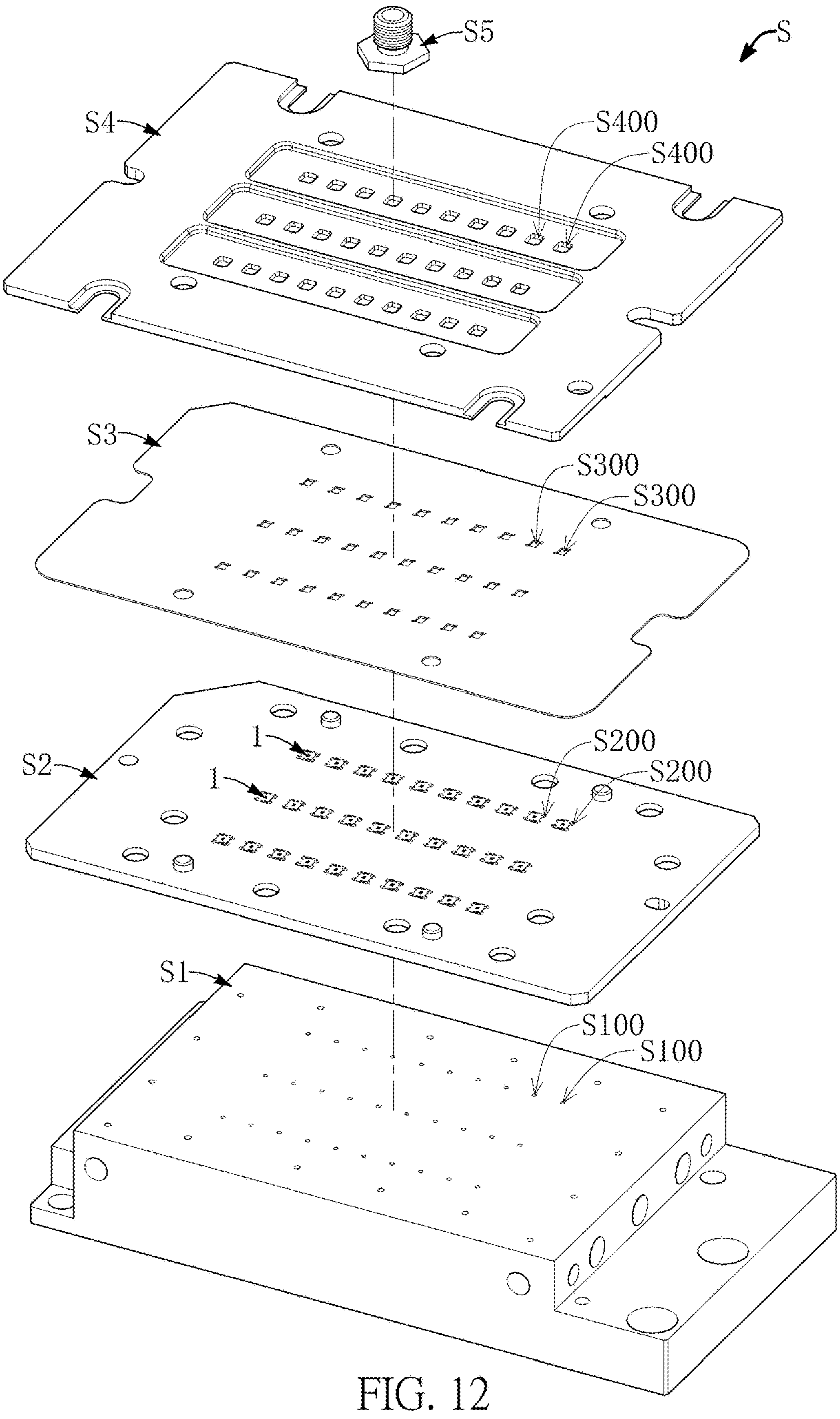
FIG. 12 is a schematic perspective exploded view of a heterogeneous chip stacking device provided by the present disclosure.
Figure 13:
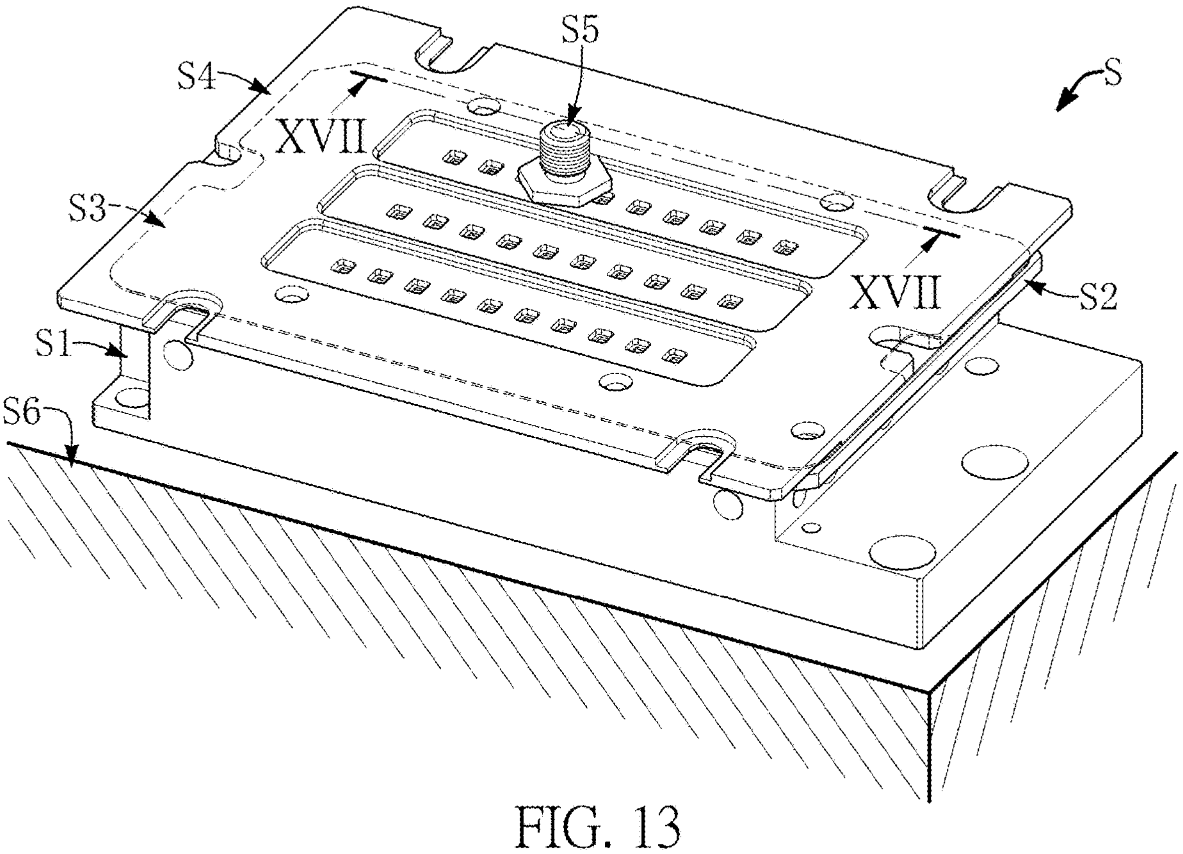
FIG. 13 is a schematic perspective assembled view of the heterogeneous chip stacking device provided by the present disclosure.
Figure 14:
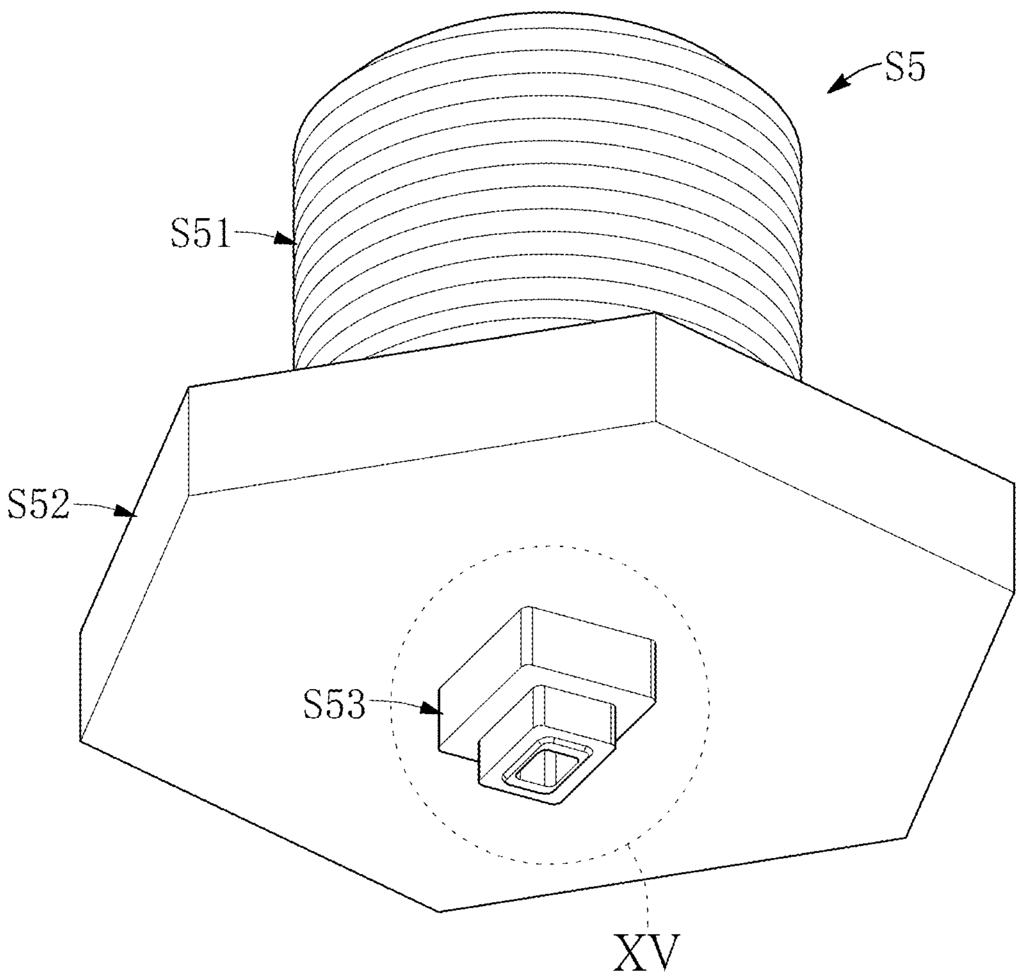
FIG. 14 is a schematic perspective view of a chip carrying structure of the heterogeneous chip stacking device provided by the present disclosure.
Figure 18:
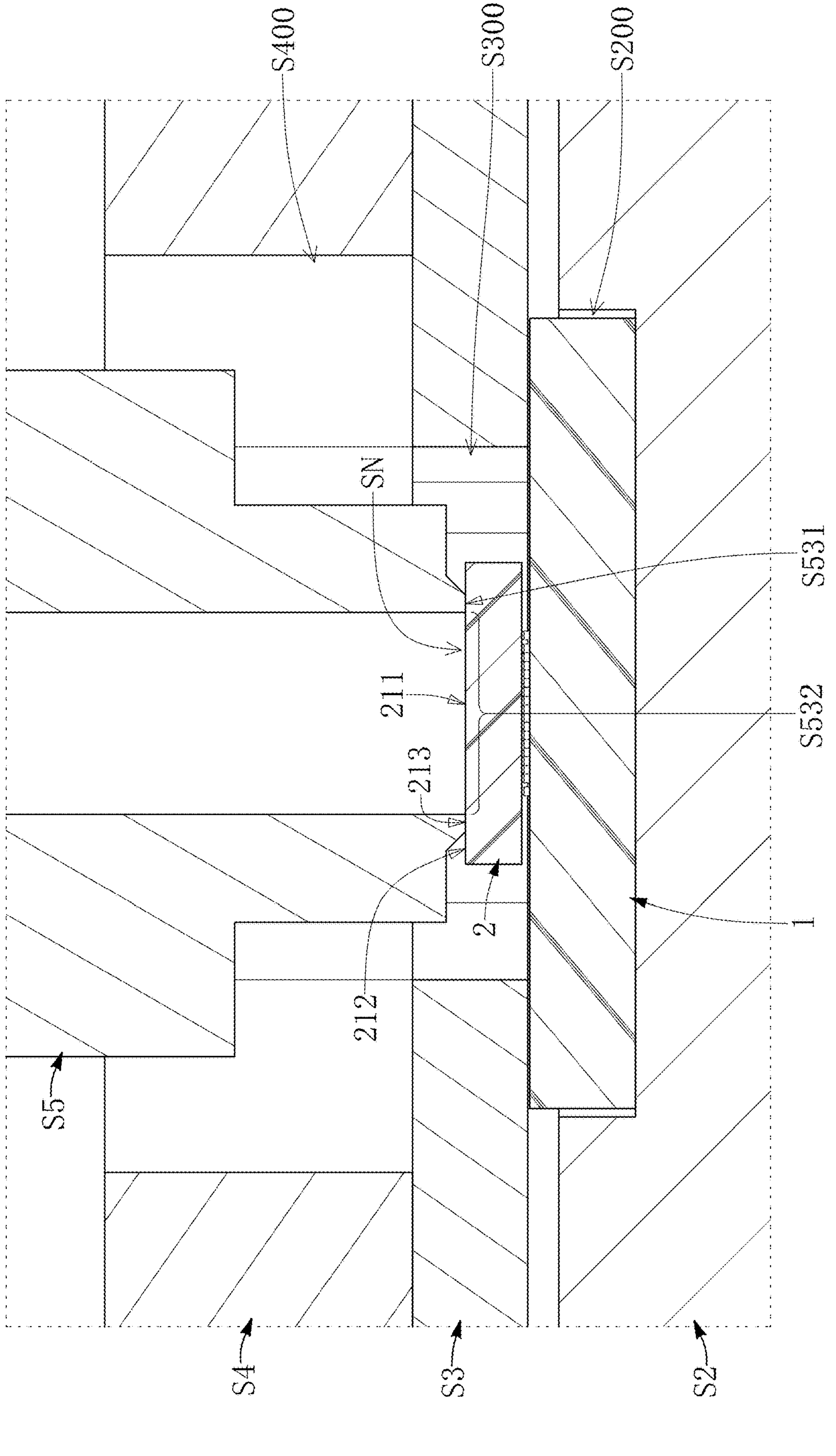
FIG. 18 is a schematic enlarged view of part XVIII of FIG. 17.

More particularly, referring to FIG. 12, FIG. 13 and FIG. 18, the position-limiting substrate structure S2 is able to be detachably disposed on the substrate carrying structure S1, the first cover structure S3 is able to be detachably disposed above the position-limiting substrate structure S2, the second cover structure S4 is able to be detachably disposed on the first cover structure S3, and the chip carrying structure S5 is able to be movably disposed above the substrate carrying structure S1. Furthermore, the position-limiting substrate structure S2 has a plurality of position-limiting grooves S200 (or limiting grooves) that can be configured to respectively accommodate a plurality of first chips 1, and the first chips 1 may be the same as the first chips 1 provided by the first embodiment or the second embodiment. Moreover, the first cover structure S3 can be configured to be disposed on the first chips 1 and press the first chips 1 (but does not contact the position-limiting substrate structure S2), and the first cover structure S3 has a plurality of first openings S300 that can be configured to respectively accommodate a plurality of second chips 2. In addition, the second cover structure S4 has a plurality of second openings S400 that can be configured to respectively communicate with the first openings S300, and the second cover structure S4 can be configured to allow a part of the chip carrying structure S5 to be accommodated in any one of the second openings S400.

Figure 17:
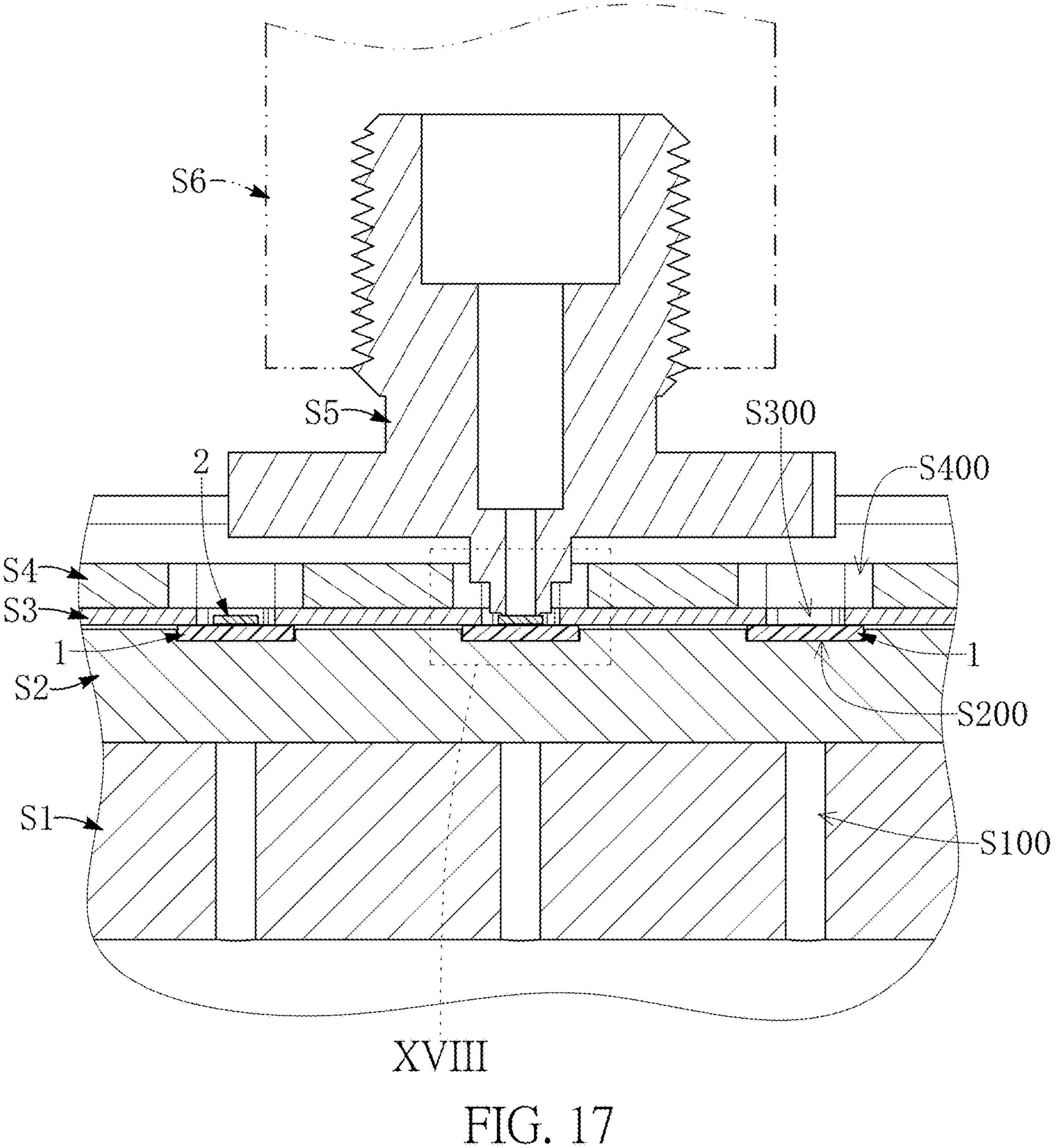
FIG. 17 is a partial cross-sectional view taken along line XVII-XVII of FIG. 13.

For example, referring to FIG. 12, FIG. 17 and FIG. 18, the substrate carrying structure S1 has a plurality of vacuum suction holes S100 that can be configured for positioning the position-limiting substrate structure S2, so that the position-limiting substrate structure S2 can be detachably disposed on the substrate carrying structure S1 through the vacuum suction of the vacuum suction holes S100. Furthermore, referring to FIG. 2 and FIG. 18, the two first alignment marks M1 of the first chip 1 can be arranged on an outer surrounding area of the first chip 1, and a portion of the outer surrounding area of each of the first chips 1 is not be covered by the first cover structure S3 (that is to say, the two first alignment marks M1 of each first chip 1 can be respectively exposed by the corresponding first opening S300 and the corresponding second opening S400). Moreover, referring to FIG. 13 and FIG. 18, the position-limiting substrate structure S2 and the first cover structure S3 can be configured to cooperate with each other through magnetic attraction or magnetic force, so that the first chips 1 can be pressed tightly between the position-limiting substrate structure S2 and the first cover structure S3, in which the magnetic structures (not shown) for providing magnetic force can be disposed on or inside at least one of the position-limiting substrate structure S2 and the first cover structure S3. In addition, referring to FIG. 13 and FIG. 18, the second opening S400 of the second cover structure S4 can be larger than the first opening S300 of the first cover structure S3, so that a part of the chip carrying structure S5 can be freely or unobstructedly accommodated in any one of the second openings S400. It should be noted that referring to FIG. 13 and FIG. 17, the substrate carrying structure S1, the position-limiting substrate structure S2, the first cover structure S3 and the second cover structure S4 can be sequentially stacked on a device body structure S6 (or a machine body structure) of the heterogeneous chip stacking device S, and the chip carrying structure S5 can be configured to be detachably connected to the device body structure S6. However, the aforementioned details are disclosed for exemplary purposes only, and are not meant to limit the scope of the present disclosure.

Figure 15:
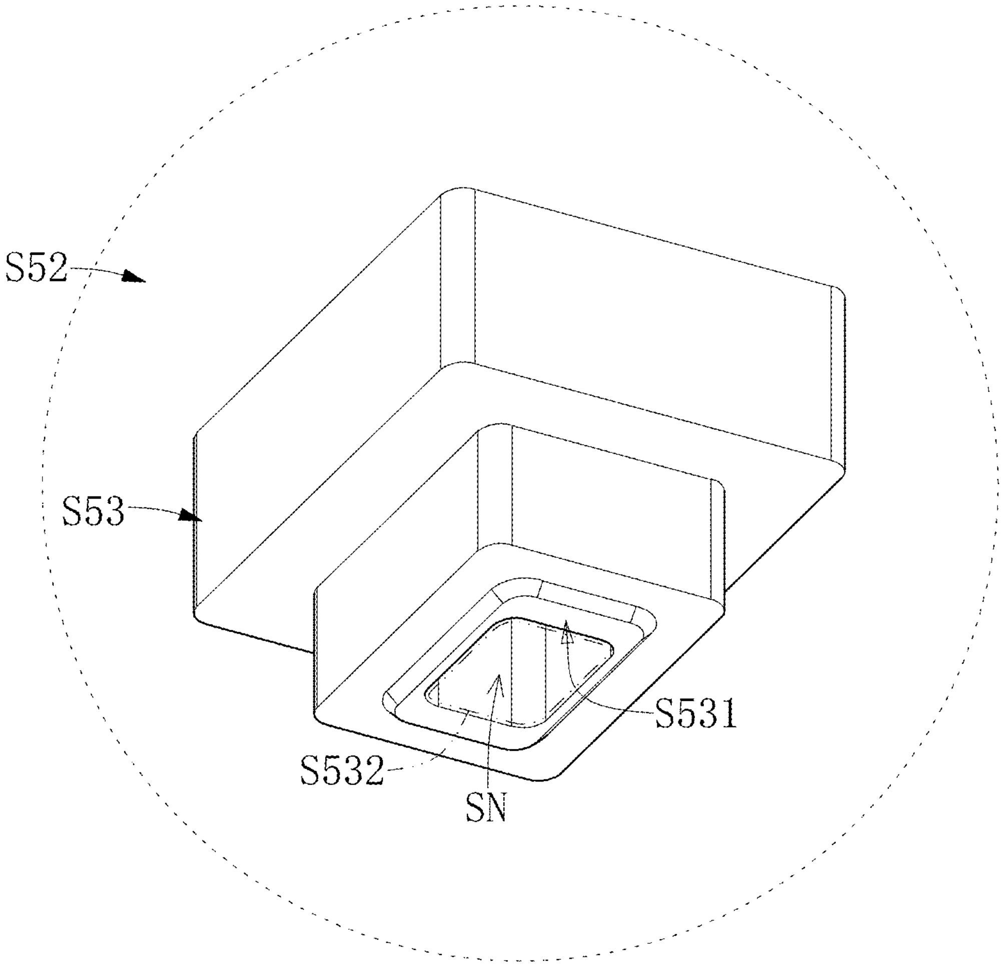
FIG. 15 is a schematic enlarged view of part XV of FIG. 14.
Figure 16:
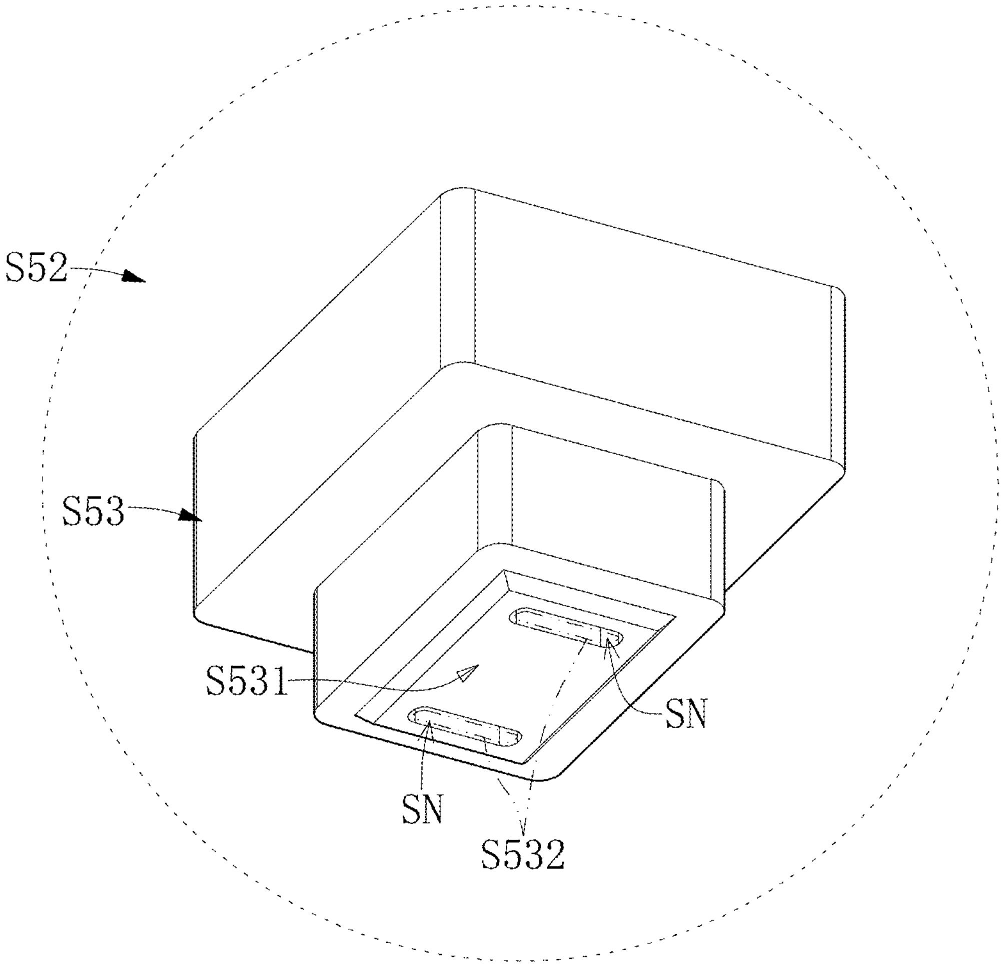
FIG. 16 is a schematic enlarged view of another chip carrying structure of the heterogeneous chip stacking device provided by the present disclosure.

For example, referring to FIG. 17 and FIG. 18, the chip carrying structure S5 can be configured for sucking or suctioning the second chip 2 and placing the second chip 2 on a corresponding one of the first chips 1, so that a plurality of first bonding pad portions 100 of a plurality of first convex pillar structures 10 of the first chip 1 and a plurality of second bonding pad portions 200 of a plurality of second convex pillar structures 20 of the second chip 2 can be in direct contact with each other and tightly coupled with each other, respectively. More particularly, referring to FIG. 14, FIG. 15, FIG. 16 and FIG. 17, the chip carrying structure S5 includes a connecting portion S51 detachably connected to the device body structure S6, a rotating portion S52 connected to the connecting portion S51, and a suction nozzle portion S53 disposed on the rotating portion S52. The connecting portion S51 of the chip carrying structure S5 has an external thread configured to be connected to the device body structure S6 for cooperating with an internal thread provided by the device body structure S6. The connecting portion S51 and the rotating portion S52 of the chip carrying structure S5 can be configured to cooperate with each other to form a hexagonal bolt, and the rotating portion S52 of the chip carrying structure S5 can be configured to be rotated by a tool. The suction nozzle portion S53 of the chip carrying structure S5 has a contact area S531 (or a convex polishing area to avoid damaging the second chip 2 due to friction) and an opening area S532 surrounded by the contact area S531, and the opening area S532 has a suction nozzle opening SN (as shown in FIG. 15) or two suction nozzle openings SN (as shown in FIG. 16) that can be in air communication with an air guiding channel. However, the aforementioned details are disclosed for exemplary purposes only, and are not meant to limit the scope of the present disclosure.

Figure 8:
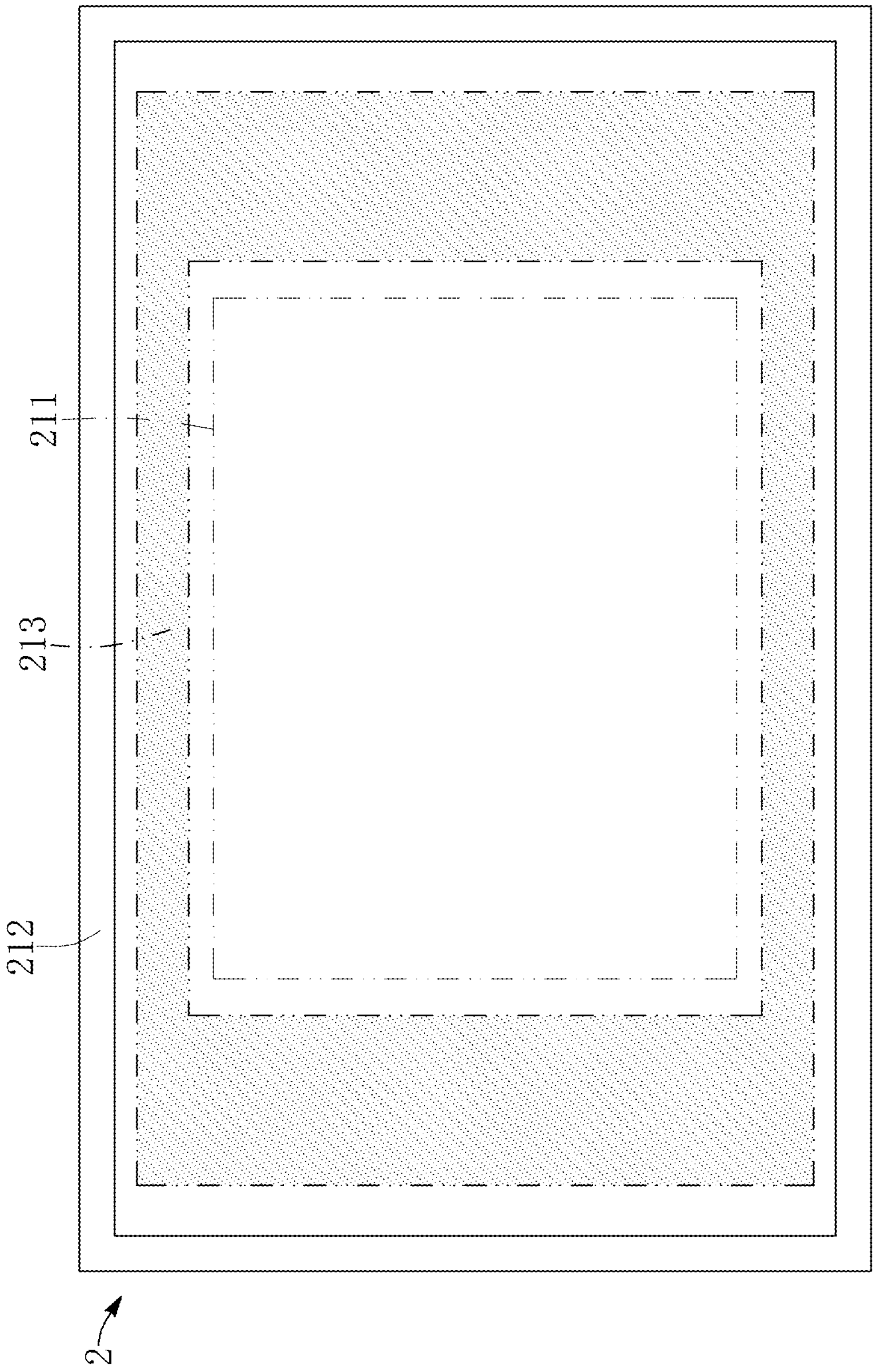
FIG. 8 is a schematic bottom view of the second chip provided by the present disclosure.
Figure 9:
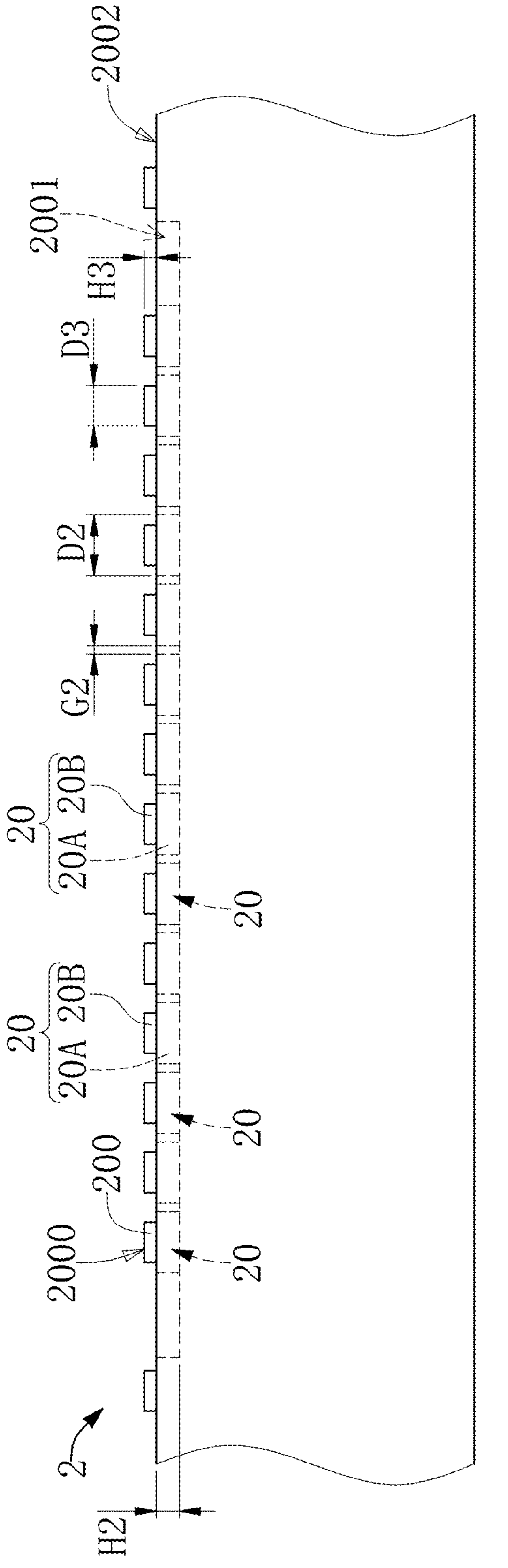
FIG. 9 is a schematic side view of the second chip provided by the present disclosure.

For example, referring to FIG. 8, FIG. 15 and FIG. 18, when the opening area S532 has the suction nozzle opening SN, the contact area S531 of the suction nozzle portion S53 of the chip carrying structure S5 can be configured to contact the suction nozzle contact area 213 of the second chip 2, the opening area S532 of the suction nozzle portion S53 of the chip carrying structure S5 can be configured to contact the light-emitting area 211 of the second chip 2, and the vertical projection of the light-emitting area 211 of the second chip 2 and the vertical projection of the receiving groove 2001 can completely fall on the opening area S532 of the suction nozzle S53. It should be noted that the contact area S531 of the suction nozzle portion S53 of the chip carrying structure S5 can be configured to be separate from the light-emitting area 211 and the outer frame area 212 of the second chip 2 each other by a predetermined distance between 40 μm and 60 μm (such as any positive integer between 40 μm and 60 μm), and the vertical projection of the contact area S531 of the suction nozzle portion S53 cannot completely fall on the light-emitting area 211 and the receiving groove 2001 of the second chip 2. However, the aforementioned details are disclosed for exemplary purposes only, and are not meant to limit the scope of the present disclosure.

For example, referring to FIG. 8 and FIG. 16, when the opening area S532 has the two suction nozzle openings SN, the contact area S531 of the suction nozzle portion S53 of the chip carrying structure S5 can be configured to contact the suction nozzle contact area 213 and the light-emitting area 211 of the second chip 2, the opening area S532 of the suction nozzle portion S53 of the chip carrying structure S5 can be configured to be separate from the light-emitting area 211 of the second chip 2 by a predetermined distance between 15 μm and 35 μm (such as any positive integer between 15 μm and 35 μm), and the vertical projection of the light-emitting area 211 of the second chip 2 and the vertical projection of the receiving groove 2001 cannot fall on the opening area S532 of the suction nozzle S53). It should be noted that the contact area S531 of the suction nozzle portion S53 of the chip carrying structure S5 can be configured to be separate from the outer frame area 212 of the second chip 2 by a predetermined distance between 30 μm and 50 μm (such as any positive integer between 30 μm and 50 μm), and the vertical projection of the light-emitting area 211 of the second chip 2 can completely fall on the contact area S531 of the suction nozzle portion S53 of the chip carrying structure S5. However, the aforementioned details are disclosed for exemplary purposes only, and are not meant to limit the scope of the present disclosure.

Fourth Embodiment

Figure 19:
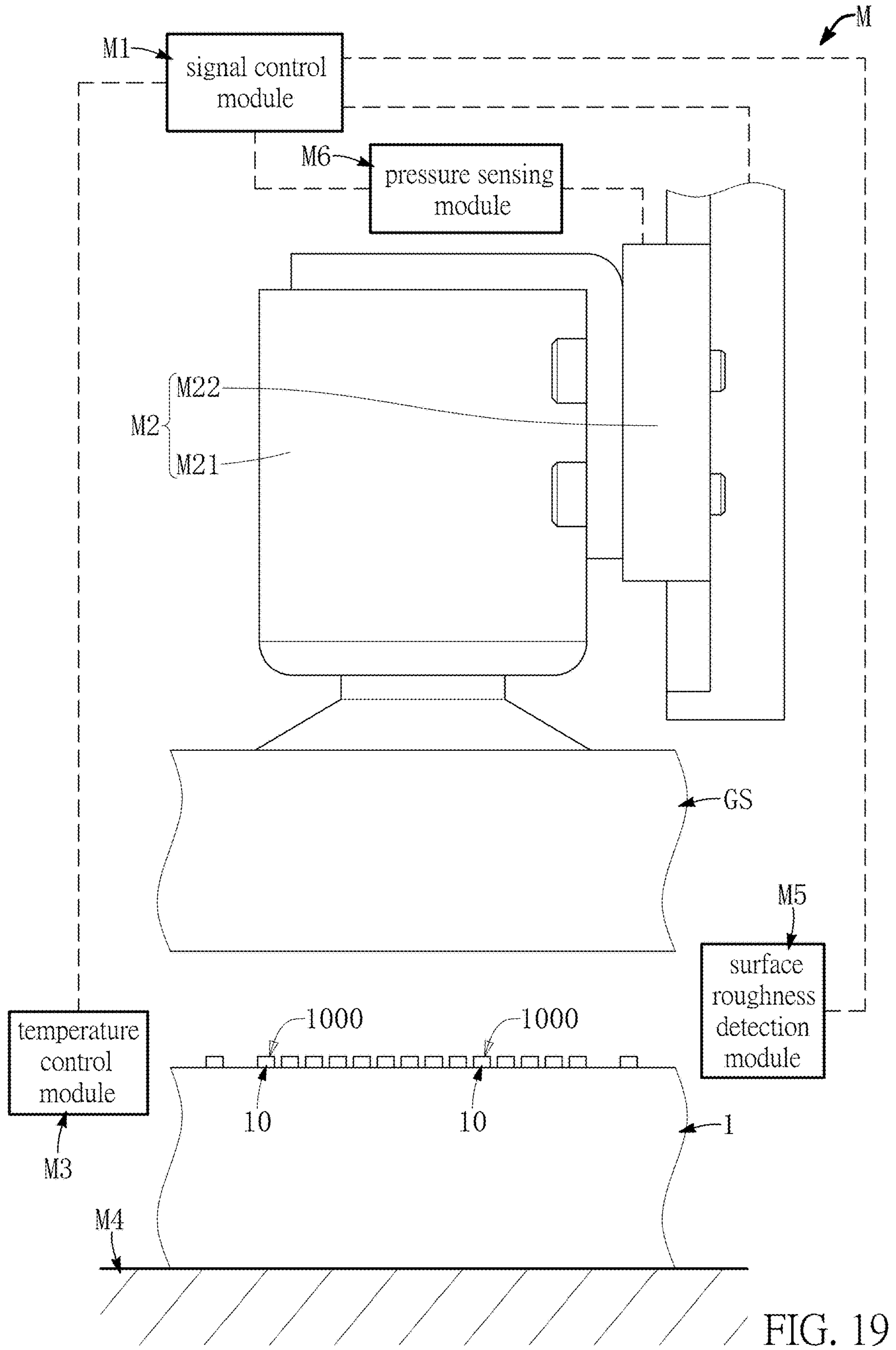
FIG. 19 is a schematic view of a chip pad surface leveling device provided by the present disclosure (before a leveling glass substrate moves downward to contact an end of the bonding pad)
Figure 20:
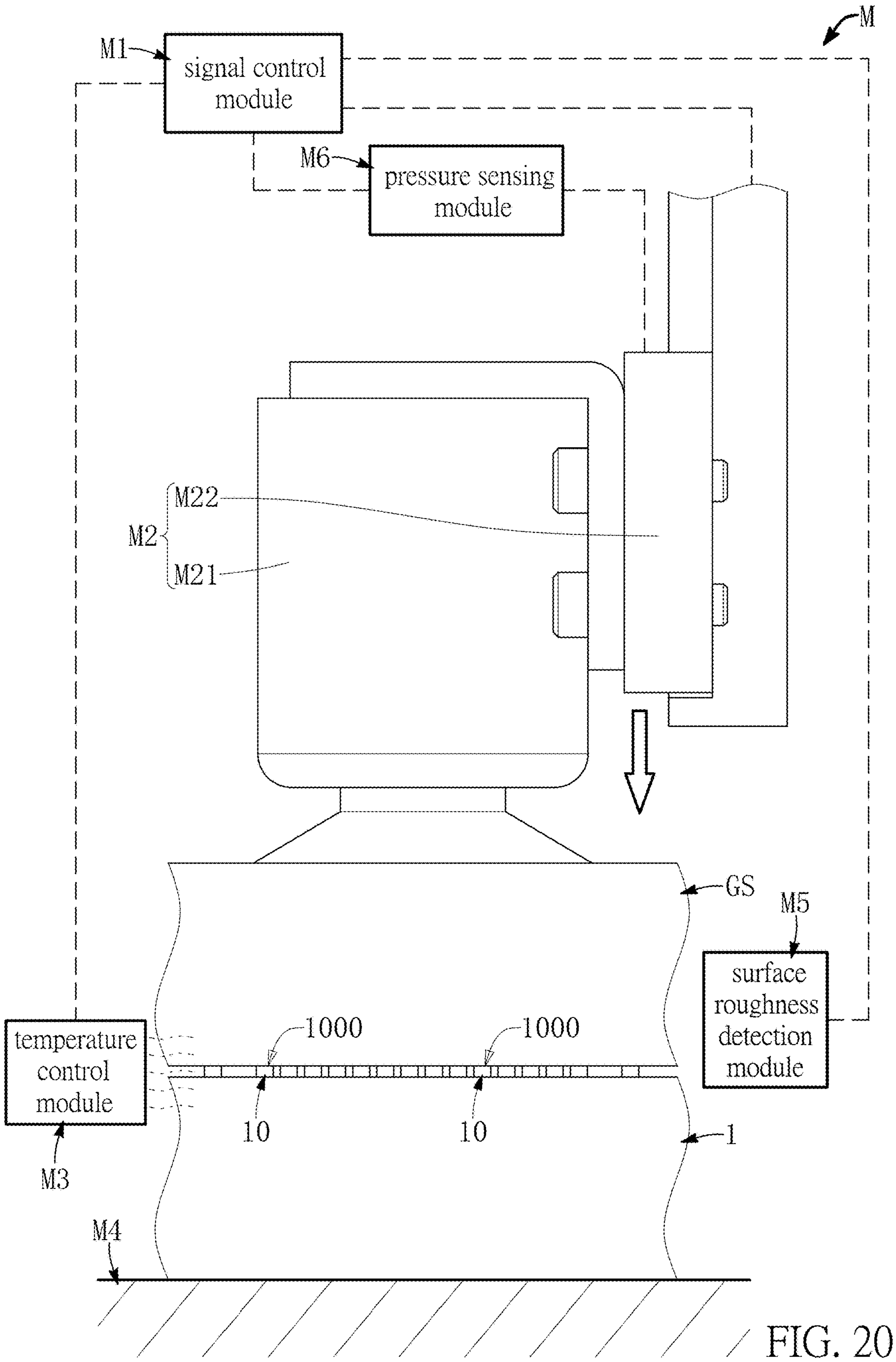
FIG. 20 is a schematic diagram of the chip pad surface leveling device provided by the present disclosure (after the leveling glass substrate moves downward to contact the end of the bonding pad).

Referring to FIG. 19 and FIG. 20, a fourth embodiment of the present disclosure provides a chip pad surface leveling device M, which includes a signal control module M1 (such as any processor including CPU, GPU, MCU, DSP, MPU, etc.), a glass carrying module M2 and a temperature control module M3. More particularly, the glass carrying module M2 can be configured to be electrically connected to the signal control module M1, and the temperature control module M3 can be configured to be electrically connected to the signal control module M1. In addition, the glass carrying module M2 can be configured to carry a leveling glass substrate GS (such as a glass substrate having a predetermined surface flatness as shown in FIG. 18), and the glass carrying module M2 can be configured to move the leveling glass substrate GS to contact a plurality of first convex pillar structures 10 of a first chip 1 (as shown in FIG. 19) or a plurality of second convex pillar structures 20 of a second chip 2 (i.e., the first chip 1 as shown in FIG. 19 can be replaced with the second chip 2), thereby making a surface roughness of a bonding pad end 1000 of each of the first convex pillar structures 10 of the first chip 1 or a surface roughness of a bonding pad end 2000 of each of the second convex pillar structures 20 of the second chip 2 is not greater than 1 μm (such as less than any positive integer below 1000 nm) through the surface leveling processing of the chip pad surface leveling device M.

For example, as shown in FIG. 20, when the glass carrying module M2 is configured to move the leveling glass substrate GS to contact the first convex pillar structures 10 of the first chip 1 (as shown in FIG. 20) or the second convex pillar structures 20 of the second chip 2 (i.e., the first chip 1 as shown in FIG. 20 can be replaced with the second chip 2), the temperature control module M3 can be configured to apply a predetermined temperature to the first convex pillar structures 10 of the first chip 1 or the second convex pillar structures 20 of the second chip 2, and the glass carrying module M2 can be configured to apply a predetermined pressure to the first convex pillar structures 10 of the first chip 1 or the second convex pillar structures 20 of the second chip 2 through the leveling glass substrate GS, thereby making a surface roughness of a bonding pad end 1000 of each of the first convex pillar structures 10 of the first chip 1 or a surface roughness of a bonding pad end 2000 of each of the second convex pillar structures 20 of the second chip 2 is not greater than 1 μm through the surface leveling processing of the chip pad surface leveling device M. It should be noted that, according to different requirements, the predetermined pressure that is indirectly applied by the glass carrying module M2 to the first convex pillar structures 10 of the first chip 1 or the second convex pillar structures 20 of the second chip 2 can be between 100 g and 2000 g (such as any positive integer between 100 g and 2000 g), and the predetermined temperature that is directly applied by the temperature control module M3 to the first convex pillar structures 10 of the first chip 1 or the second convex pillar structures 20 of the second chip 2 can be between 250° C. and 290° C. (such as any positive integer between 250° C. and 290° C.). However, the aforementioned details are disclosed for exemplary purposes only, and are not meant to limit the scope of the present disclosure.

For example, referring to FIG. 19 and FIG. 20, the chip pad surface leveling device M further includes a chip carrying module M4 (such as a device platform), the chip carrying module M4 can be configured to be fixedly or movably disposed below the glass carrying module M2, and the chip carrying module M4 can be configured for carrying the first chip 1 or the second chip 2 through vacuum suction or a clamping device. However, the aforementioned details are disclosed for exemplary purposes only, and are not meant to limit the scope of the present disclosure.

For example, referring to FIG. 19 and FIG. 20, the chip pad surface leveling device M further includes a surface roughness detection module M5, the surface roughness detection module M5 can be configured to be electrically connected to the signal control module M1, or the surface roughness detection module M5 may also be another detection equipment that is separate from the chip pad surface leveling device M. It should be noted that, when the leveling glass substrate GS is far away from the first chip 1 or the second chip 2 (as shown in FIG. 19) or when the leveling glass substrate GS is placed on the first chip 1 or the second chip 2 (as shown in FIG. 20), the surface roughness detection module M5 can be configured for detecting the surface roughness of the bonding pad end 1000 of each of the first convex pillar structures 10 of the first chip 1 or the surface roughness of the bonding pad end 2000 of each of the second convex pillar structures 20 of the second chip 2 (i.e., the first chip 1 as shown in FIG. 20 can be replaced with the second chip 2). However, the aforementioned details are disclosed for exemplary purposes only, and are not meant to limit the scope of the present disclosure.

For example, referring to FIG. 19 and FIG. 20, the glass carrying module M2 includes a suction nozzle structure M21 (can be used to provide a vacuum suction) and a driving structure M22 (can be used to provide a driving force) connected to the suction nozzle structure M21, the suction nozzle structure M21 can be configured to suck or suction the leveling glass substrate GS through the signal control module M1, and the driving structure M22 can be configured to move the suction nozzle structure M21 in any direction (which has configured to suck or suction the leveling glass substrate GS) through the signal control module M1. More particularly, the driving structure M22 can be configured to drive the suction nozzle structure M21 to move downward by the same predetermined speed or different predetermined speeds (such as a first predetermined speed or a second predetermined speed greater than the first predetermined speed), so that the leveling glass substrate GS that has sucked or suctioned by the suction nozzle structure M21 can be configured to contact and press the bonding pad ends 1000 of the first convex pillar structures 10 of the first chip 1 or the bonding pad ends 2000 of the second convex pillar structures 20 of the second chip 2 (i.e., the first chip 1 as shown in FIG. 19 and FIG. 20 can be replaced with a second chip 2). However, the aforementioned details are disclosed for exemplary purposes only, and are not meant to limit the scope of the present disclosure.

For example, referring to FIG. 19 and FIG. 20, the chip pad surface leveling device M further includes a pressure sensing module M6, and the pressure sensing module M6 can be configured to be electrically connected to the signal control module M1. More particularly, the pressure sensing module M6 can be configured to be connected to the glass carrying module M2 for determining whether the leveling glass substrate GS contacts the bonding pad ends 1000 of the first convex pillar structures 10 of the first chip 1 or the bonding pad ends 2000 of the second convex pillar structures 20 of the second chip 2 (i.e., the first chip 1 as shown in FIG. 19 and FIG. 20 can be replaced with a second chip 2). However, the aforementioned details are disclosed for exemplary purposes only, and are not meant to limit the scope of the present disclosure.

Beneficial Effects of the Embodiments

In conclusion, in the heterogeneous chip stacking method provided by the present disclosure, by virtue of "providing a first chip 1, in which the first chip 1 has a plurality of first convex pillar structures 10 gradually formed outward from the first chip 1 within a first predetermined time, and each of the first convex pillar structures 10 has a first bonding pad portion 100," "providing a second chip 2 that is different from the first chip 1, in which the second chip 2 has a plurality of second convex pillar structures 20 gradually formed outward from the second chip 2 within a second predetermined time, and each of the second convex pillar structures 20 has a second bonding pad portion 200," "placing the first chip 1 on the second chip 2, in which the first bonding pad portions 100 of the first convex pillar structures 10 of the first chip 1 and the second bonding pad portions 200 of the second convex pillar structures 20 of the second chip 2 are in direct contact with each other respectively" and "applying at least one of a predetermined pressure, a predetermined temperature, and a predetermined ultrasonic frequency to tightly couple the first bonding pad portions 100 of the first convex pillar structures 10 of the first chip 1 and the second bonding pad portions 200 of the second convex pillar structures 20 of the second chip 2 with each other respectively," the two heterogeneous chips (i.e., the first chip 1 and the second chip 2) can be stacked together. For example, the first convex pillar structure 10 (or the first convex columnar structure) is not formed by directly placing a pre-prepared solder ball (or a previously prepared solder ball) on the first chip 1, and the second convex pillar structure 20 (or the second convex columnar structure) is not formed by directly placing another pre-prepared solder ball (or another previously prepared solder ball) on the second chip 2.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A heterogeneous chip stacking method, comprising:

providing a first chip, wherein the first chip has a plurality of first convex pillar structures gradually formed outward from the first chip within a first predetermined time, and each of the first convex pillar structures has a first bonding pad portion;

providing a second chip that is different from the first chip, wherein the second chip has a plurality of second convex pillar structures gradually formed outward from the second chip within a second predetermined time, and each of the second convex pillar structures has a second bonding pad portion;

placing the first chip on the second chip, wherein the first bonding pad portions of the first convex pillar structures of the first chip and the second bonding pad portions of the second convex pillar structures of the second chip are in direct contact with each other respectively; and applying at least one of a predetermined pressure, a predetermined temperature, and a predetermined ultrasonic frequency to tightly couple the first bonding pad portions of the first convex pillar structures of the first chip and the second bonding pad portions of the second convex pillar structures of the second chip with each other respectively;

wherein the first convex pillar structure is not formed by directly placing a pre-prepared solder ball on the first chip;

wherein the second convex pillar structure is not formed by directly placing another pre-prepared solder ball on the second chip.

2. The heterogeneous chip stacking method according to claim 1, wherein the first chip is a single-photon avalanche diode chip containing silicon, and the second chip is a vertical cavity surface emitting laser chip containing gallium arsenide;

wherein the first convex pillar structures of the first chip are divided into a plurality of series bonding pad areas that are separate from each other, and the first convex pillar structures in each of the series bonding pad areas are connected to each other in series;

wherein the first chip includes a plurality of top conductive pads respectively and electrically connected to the series bonding pad areas, a plurality of bottom conductive pads respectively corresponding to the top conductive pads, and a plurality of conductive penetration bodies each correspondingly connected between a corresponding one of the top conductive pads and a corresponding one of the bottom conductive pads;

wherein the second convex pillar structures of the second chip are separate from each other, and the second chip has a light-emitting area that is larger than a distribution area of the second convex pillar structures, and the second convex pillar structure and the light-emitting area of the second chip are respectively disposed on two opposite surfaces of the second chip;

wherein the second chip has a lower surface and a receiving groove recessed from the lower surface, and each of the second convex pillar structures includes a pillar-shaped base disposed in the receiving groove and a pillar-shaped conductor disposed on the pillar-shaped base, and a top surface of the pillar-shaped base of each of the second convex pillar structures and the lower surface of the second chip are flush with each other;

wherein each of the first chips has two first alignment marks arranged diagonally on a top side thereof, and each of the second chips has two second alignment marks arranged diagonally on a bottom side thereof;

wherein in the step of placing the first chip on the second chip, the two first alignment marks of the first chip are adjacent and correspond to the two second alignment marks of the second chip, respectively.

3. The heterogeneous chip stacking method according to claim 1, wherein each of the first convex pillar structures has a first diameter ranging from 15 μm to 30 μm and a first height ranging from 10 μm to 20 μm;

wherein the pillar-shaped base of each of the second convex pillar structures has a second diameter ranging from 25 μm to 35 μm and a second height ranging from 5 μm to 10 μm, and the pillar-shaped conductor of each of the second convex pillar structures has a third diameter ranging from 15 μm to 25 μm and a third height ranging from 3 μm to 8 μm;

wherein a surface roughness of a bonding pad end of each of the first convex pillar structures of the first chip is not greater than 1 μm, and a surface roughness of a bonding pad end of each of the second convex pillar structures of the second chip is not greater than 1 μm;

wherein a first pad spacing between any two adjacent ones of the first convex pillar structures of the first chip is between 35 μm and 45 μm, and a second pad spacing between any two adjacent ones of the second convex pillar structures of the second chip is between 35 μm and 45 μm;

wherein in the step of placing the first chip on the second chip, a chip vertical distance between a lower surface of the second chip and an upper surface of the first chip is between 10 μm and 15 μm.

4. The heterogeneous chip stacking method according to claim 1, wherein, in the step of providing the first chip, the first convex pillar structures of the first chip are gradually formed on the first chip within the first predetermined time through sputtering or evaporation;

wherein, in the step of providing the second chip, the second convex pillar structures of the second chip are gradually formed in a receiving groove of the second chip within the second predetermined time through sputtering or evaporation;

wherein, in the step of placing the first chip on the second chip, an insulating filling material is configured to be filled between the first chip and the second chip;

wherein, before the step of placing the first chip on the second chip, the heterogeneous chip stacking method further comprises: leveling a plurality of bonding pad ends of the first convex pillar structures of the first chip or a plurality of bonding pad ends of the second convex pillar structures of the second chip by using a chip pad surface leveling device, thereby making a surface roughness of the bonding pad end of each of the first convex pillar structures of the first chip or a surface roughness of the bonding pad end of each of the second convex pillar structures of the second chip is not greater than 1 μm.

5. The heterogeneous chip stacking method according to claim 1, wherein, before the step of placing the first chip on the second chip, the heterogeneous chip stacking method further comprises: leveling a plurality of bonding pad ends of the first convex pillar structures of the first chip or a plurality of bonding pad ends of the second convex pillar structures of the second chip by using a chip pad surface leveling device;

wherein the chip pad surface leveling device includes a signal control module, a glass carrying module electrically connected to the signal control module, and a temperature control module electrically connected to the signal control module;

wherein the glass carrying module is configured to carry and move a leveling glass substrate to contact the first convex pillar structures of the first chip or the second convex pillar structures of the second chip;

wherein the temperature control module is configured to apply a predetermined temperature to the first convex pillar structures of the first chip or the second convex pillar structures of the second chip, and the glass carrying module is configured to apply a predetermined pressure to the first convex pillar structures of the first chip or the second convex pillar structures of the second chip through the leveling glass substrate, thereby making a surface roughness of the bonding pad end of each of the first convex pillar structures of the first chip or a surface roughness of the bonding pad end of each of the second convex pillar structures of the second chip is not greater than 1 μm.

6. A heterogeneous chip stacking method, comprising:

providing a first chip, wherein the first chip has a plurality of first convex pillar structures gradually formed outward from the first chip within a first predetermined time, and each of the first convex pillar structures has a first bonding pad portion;

providing a second chip that is different from the first chip, wherein the second chip has a plurality of second convex pillar structures gradually formed outward from the second chip within a second predetermined time, and each of the second convex pillar structures has a second bonding pad portion;

placing the first chip on the second chip, wherein the first bonding pad portions of the first convex pillar structures of the first chip and the second bonding pad portions of the second convex pillar structures of the second chip are in direct contact with each other respectively; and applying at least one of a predetermined pressure, a predetermined temperature, and a predetermined ultrasonic frequency to tightly couple the first bonding pad portions of the first convex pillar structures of the first chip and the second bonding pad portions of the second convex pillar structures of the second chip with each other respectively.

7. The heterogeneous chip stacking method according to claim 6, wherein the first chip is a single-photon avalanche diode chip containing silicon, and the second chip is a vertical cavity surface emitting laser chip containing gallium arsenide;

wherein the first convex pillar structures of the first chip are divided into a plurality of series bonding pad areas that are separate from each other, and the first convex pillar structures in each of the series bonding pad areas are connected to each other in series;

wherein the first chip includes a plurality of top conductive pads respectively and electrically connected to the series bonding pad areas, a plurality of bottom conductive pads respectively corresponding to the top conductive pads, and a plurality of conductive penetration bodies each correspondingly connected between a corresponding one of the top conductive pads and a corresponding one of the bottom conductive pads;

wherein the second convex pillar structures of the second chip are separate from each other, and the second chip has a light-emitting area that is larger than a distribution area of the second convex pillar structures, and the second convex pillar structure and the light-emitting area of the second chip are respectively disposed on two opposite surfaces of the second chip;

wherein the second chip has a lower surface and a receiving groove recessed from the lower surface, and each of the second convex pillar structures includes a pillar-shaped base disposed in the receiving groove and a pillar-shaped conductor disposed on the pillar-shaped base, and a top surface of the pillar-shaped base of each of the second convex pillar structures and the lower surface of the second chip are flush with each other;

wherein each of the first chips has two first alignment marks arranged diagonally on a top side thereof, and each of the second chips has two second alignment marks arranged diagonally on a bottom side thereof;

wherein in the step of placing the first chip on the second chip, the two first alignment marks of the first chip are adjacent and correspond to the two second alignment marks of the second chip, respectively.

8. The heterogeneous chip stacking method according to claim 6, wherein each of the first convex pillar structures has a first diameter ranging from 15 μm to 30 μm and a first height ranging from 10 μm to 20 μm;

wherein the pillar-shaped base of each of the second convex pillar structures has a second diameter ranging from 25 μm to 35 μm and a second height ranging from 5 μm to 10 μm, and the pillar-shaped conductor of each of the second convex pillar structures has a third diameter ranging from 15 μm to 25 μm and a third height ranging from 3 μm to 8 μm;

wherein a surface roughness of a bonding pad end of each of the first convex pillar structures of the first chip is not greater than 1 μm, and a surface roughness of a bonding pad end of each of the second convex pillar structures of the second chip is not greater than 1 μm;

wherein a first pad spacing between any two adjacent ones of the first convex pillar structures of the first chip is between 35 μm and 45 μm, and a second pad spacing between any two adjacent ones of the second convex pillar structures of the second chip is between 35 μm and 45 μm;

wherein in the step of placing the first chip on the second chip, a chip vertical distance between a lower surface of the second chip and an upper surface of the first chip is between 10 μm and 15 μm.

9. The heterogeneous chip stacking method according to claim 6, wherein, in the step of providing the first chip, the first convex pillar structures of the first chip are gradually formed on the first chip within the first predetermined time through sputtering or evaporation;

wherein, in the step of providing the second chip, the second convex pillar structures of the second chip are gradually formed in a receiving groove of the second chip within the second predetermined time through sputtering or evaporation;

wherein, in the step of placing the first chip on the second chip, an insulating filling material is configured to be filled between the first chip and the second chip;

wherein, before the step of placing the first chip on the second chip, the heterogeneous chip stacking method further comprises: leveling a plurality of bonding pad ends of the first convex pillar structures of the first chip or a plurality of bonding pad ends of the second convex pillar structures of the second chip by using a chip pad surface leveling device, thereby making a surface roughness of the bonding pad end of each of the first convex pillar structures of the first chip or a surface roughness of the bonding pad end of each of the second convex pillar structures of the second chip is not greater than 1 μm.

10. The heterogeneous chip stacking method according to claim 6, wherein, before the step of placing the first chip on the second chip, the heterogeneous chip stacking method further comprises: leveling a plurality of bonding pad ends of the first convex pillar structures of the first chip or a plurality of bonding pad ends of the second convex pillar structures of the second chip by using a chip pad surface leveling device;

wherein the chip pad surface leveling device includes a signal control module, a glass carrying module electrically connected to the signal control module, and a temperature control module electrically connected to the signal control module;

wherein the glass carrying module is configured to carry and move a leveling glass substrate to contact the first convex pillar structures of the first chip or the second convex pillar structures of the second chip;

wherein the temperature control module is configured to apply a predetermined temperature to the first convex pillar structures of the first chip or the second convex pillar structures of the second chip, and the glass carrying module is configured to apply a predetermined pressure to the first convex pillar structures of the first chip or the second convex pillar structures of the second chip through the leveling glass substrate, thereby making a surface roughness of the bonding pad end of each of the first convex pillar structures of the first chip or a surface roughness of the bonding pad end of each of the second convex pillar structures of the second chip is not greater than 1 μm.

* * * * *